US006859261B2

(12) United States Patent
Opower et al.

(10) Patent No.: US 6,859,261 B2
(45) Date of Patent: Feb. 22, 2005

(54) LITHOGRAPHY EXPOSURE DEVICE

(75) Inventors: Hans Opower, Krailling (DE); Stefan Scharl, Wasserburg (DE)

(73) Assignee: KLEO Halbleitertechnik GmbH & Co KG, Tettnang (DE)

( * ) Notice: Subject to any disclaimer, the term of this patent is extended or adjusted under 35 U.S.C. 154(b) by 25 days.

(21) Appl. No.: 10/314,002

(22) Filed: Dec. 6, 2002

(65) Prior Publication Data

US 2003/0160948 A1 Aug. 28, 2003

(30) Foreign Application Priority Data

Dec. 7, 2001 (DE) .......................................... 101 60 917

(51) Int. Cl.[7] ........................ G03B 27/42; G03B 27/52; G03B 27/54
(52) U.S. Cl. .............................. 355/55; 355/53; 355/67
(58) Field of Search .............................. 355/53, 55, 67, 355/68

(56) References Cited

U.S. PATENT DOCUMENTS 5,475,416 A * 12/1995 Kessler et al. .............. 347/244

6,025,864 A 2/2000 Nashimoto

FOREIGN PATENT DOCUMENTS

| DE | 43 13 111 | 10/1994 |
| DE | 195 34 165 | 5/1996 |
| DE | 195 29 656 | 2/1997 |
| DE | 693 27 425 | 12/1999 |
| DE | 695 19 221 | 10/2000 |
| EP | 0 573 375 | 12/1999 |
| EP | 0 729 265 | 10/2000 |

* cited by examiner

Primary Examiner—Rodney Fuller
(74) Attorney, Agent, or Firm—Barry R. Lipsitz; Douglas M. McAllister

(57) ABSTRACT

A lithography exposure device for producing exposed structures in a layer sensitive to light includes an exposure unit with a movement unit for the relative movement between the optical focusing element and a mounting device. A controler is provided for controlling intensity and position of the exposure spots, such that a plurality of conversion areas can be produced in the light-sensitive layer via the exposure spots. A controllable deflection device is provided between the laser radiation sources and the optical focusing means for the movement of the exposure spot in the deflection direction.

50 Claims, 23 Drawing Sheets

LITHOGRAPHY EXPOSURE DEVICE

The invention relates to a lithography exposure device for producing exposed structures extending in a surface area in a layer sensitive to light, comprising a mounting device for the light-sensitive layer, an exposure unit comprising several laser radiation sources, an optical focusing means associated with the laser radiation sources for the laser radiation turning out of the respective laser radiation sources, this optical focusing means generating from the laser radiation of each of the laser radiation sources an exposure spot effective in the light-sensitive layer with a predetermined extension transverse to an exposure movement direction, comprising a movement unit for generating a relative movement between the optical focusing means and the mounting device in the exposure movement direction and comprising a control of intensity and position of the exposure spots relative to the light-sensitive layer in such a manner that a plurality of conversion areas, in which the material of the light-sensitive layer is converted from an initial state into an exposed state and which together result in the exposed structure, can be generated in the light-sensitive layer by means of the exposure spots.

Lithography exposure devices of this type are known from WO 98/00760.

In the case of these lithography exposure devices, there is the problem that a large number of exposure spots is required in order to generate an exposed structure in a predetermined surface area with the necessary precision since the maximum possible extension of the exposed structure transversely to the exposure movement direction must be realized by exposure spots overlapping one another.

As a consequence, a plurality of laser radiation sources must be used—when it is assumed that one laser radiation source is required for each exposure spot.

The object underlying the invention is, therefore, to provide a lithography exposure device of the type described at the outset, with which work can be carried out with a reduced number of laser radiation sources.

This object is accomplished in accordance with the invention, in a lithography exposure device of the type described at the outset, in that with the exposure spot of each of the laser radiation sources all the conversion areas located within a strip area, which extends in the exposure movement direction and has transversely to the exposure movement direction a width amounting to a multiple of the extension of the exposure spot in this direction, can be generated within the same due to movement of the exposure spot in a deflection direction extending transversely to the exposure movement direction and that a controllable deflection device is provided between the laser radiation sources and the optical focusing means for the movement of the exposure spot in the deflection direction.

The advantage of the inventive solution is therefore to be seen in the fact that the possibility of reducing the number of laser radiation sources has been created by means of the strip areas provided, within which all the conversion areas can be generated with a single exposure spot.

Furthermore, the possibility of moving the exposure spot in the deflection direction provides the possibility of improving the precision in the area of the edges of the exposed structure, i.e., the so-called wavy edges.

With respect to the principle of beam deflection which is intended to be used in the deflection device, the most varied of solutions are conceivable.

For example, mechanical deflections or deflection devices operating piezoelectrically would be conceivable.

It has, however, proven to be particularly advantageous for achieving a deflection of the laser radiation which is as quick as possible and as precise as possible when the deflection device operates electro-optically.

In principle, it would be conceivable to place the strip areas associated with the laser radiation sources at a distance from one another and to expose them, following one pass in the exposure movement direction, with a renewed pass in the intermediate spaces between the strip areas. This would have the additional advantage, in the case of a predetermined surface area, that additional laser radiation sources could be dispensed with but the disadvantage of a precision which is no longer satisfactory.

For this reason, it is advantageously provided for the strip areas associated with the laser radiation sources to be located directly next to one another and, therefore, completely cover a predetermined surface area to be exposed with an exposure movement transversely to the exposure movement direction.

However, in order to be able to generate, at the edges of the strip areas, conversion areas connected with the exposure spots respectively associated with these strip areas with continuous conversion of the material of the light-sensitive layer into the exposed state, it is advantageously provided for the strip areas located next to one another to overlap transversely to the exposure movement direction.

In principle, it would likewise be conceivable to also place several strip areas so as to abut on one another in exposure movement direction.

It is, however, particularly favorable when the strip areas extend over the entire light-sensitive layer in exposure movement direction so that an exposure over the entire light-sensitive layer takes place in exposure movement direction during the generation of the exposed structure.

The deflection device could be of different designs within the scope of the inventive solution. For example, it would be conceivable to control the deflection device as a whole and thereby, however, activate only those laser radiation sources, the laser radiation of which has to be deflected at the respective point of time to exactly the same extent as the deflection device at the respective point of time.

However, in order to achieve as great an exposure power as possible it has proven to be advantageous when the deflection device has a separate deflection unit for the laser radiation of each laser radiation source, with which the deflection of the laser radiation is brought about in the deflection direction for the positioning of the exposure spot in deflection direction within the strip area corresponding to it.

This solution has the advantage that in the case of a relative moment in the exposure movement direction for generating the exposed structure all those laser radiation sources, the exposure spots of which are intended to contribute to the conversion area to be generated at the respective point of time, can always be controlled at any point of time, wherein the velocity during the positioning of the exposure spot in deflection direction has to be selected to be so great that, for example, a continuous movement in exposure movement direction does not cause any appreciable distortions.

This results, for example, in the movement of one of the exposure spots in deflection direction within the strip area associated with it taking place within a period of time of less than 10 ns insofar as the velocity in exposure movement direction is 1 m/s, wherein the width of the strip area should correspond, for example, to approximately ten times the extension of the light spot in deflection direction.

In principle, it would be conceivable to provide a grid positioning of the light spot within the strip area, wherein the grid positioning of the light spot would have to be such that the conversion area generated by the exposure spot in a grid position overlaps at least with the exposure spot in the adjacent grid position.

It is, however, more simple when the exposure spot can be positioned within the strip area as required in the deflection direction with the deflection unit.

Each of the deflection units of the deflection device is, therefore, preferably controllable individually by the control.

With respect to the arrangement of the deflection units themselves, no further details have so far been given. It would, in principle, be conceivable to arrange the deflection units next to one another in a plane which extends parallel to the deflection directions of the deflection units which extend parallel to one another.

As a result, the problem could, however, occur that the constructional concept of the individual deflection units relative to one another could be realized only in a complicated manner on account of the slight distances between the deflection units.

For this reason, one particularly advantageous embodiment of the inventive lithography exposure device provides for the deflection units to be arranged in several planes following one another in the exposure movement direction.

In this respect, it is particularly favorable that in the case of a sequence of strip areas following one another in deflection direction the deflection units of strip areas adjacent to one another in the sequence of strip areas are located in different planes.

By placing the deflection devices, which are associated with adjacent strip areas, in different planes, the inventive deflection device may be produced more simply from a constructional point of view and, therefore, also more inexpensively.

In this respect, it is particularly favorable when in the case of the sequence of strip areas following one another those deflection units, which are associated with the strip areas separated from one another in the sequence of strip areas by at least one strip area located therebetween, are located in the same plane.

A further solution which can be realized particularly favorably provides for the deflection units for the strip areas, which are located separate from one another in the sequence of the strip areas by a place number corresponding to the number of planes, to be located in each of the planes following one another in exposure movement direction.

This means that in the case of two planes deflection units respectively associated with the next but one strip area are located in one plane and in the case of three planes the deflection units respectively associated with the strip areas after the next but one areas are located in one and the same plane.

Details have no longer been given in conjunction with the preceding explanations concerning the individual embodiments as to how the individual deflection units are intended to be constructed.

It has proven to be particularly favorable when each electro-optical deflection unit has at least one beam-deflecting spatial area which consists of electro-optical material, has the laser radiation passing through it and in which the refractive index is variable electro-optically in comparison with the refractive index in its surroundings and that with a refractive index in the at least one spatial area deviating from the refractive index of the surroundings the sum of the spatial areas of the deflection unit causes the laser radiation to exit from the deflection unit in an exiting direction extending differently in comparison with an original direction.

The advantage of this solution is to be seen in the fact that the deflection of the laser radiation may be variably adjusted due to the variable setting of the refractive index in the at least one spatial area and, therefore, it is possible to vary the deviation in the course of the exiting direction and the original direction as a result of the adjustment of the refractive index, wherein a step-like or a step-less adjustment of the refractive index is possible and, therefore, a step-like or a step-less variation of the altered course of the exiting direction in comparison with the original direction is also possible.

A particularly favorable solution provides in this respect for the spatial area to be formed within a waveguide plate consisting of electro-optical material and extending with its flat sides parallel to the deflection direction. The provision of such a waveguide plate for guiding the laser radiation has the advantage that, as a result, it is possible to guide the laser radiation in a small space at least in one direction transverse to the direction of propagation and to avoid any divergence in this direction within the waveguide plate.

For reasons of the simple manufacture of such a waveguide plate it is expedient when the waveguide plate itself consists of electro-optical material and extends beyond the spatial area so that as a result of the electro-optical material of the waveguide plate the refractive index in the surroundings of the spatial area and, therefore, the effect of the spatial area on the laser radiation also depends on the difference between the refractive index outside the spatial area and the refractive index within the spatial area.

In order to be able to vary the refractive index in the spatial area in a simple manner, it is preferably provided for the spatial area to be arranged between a first and a second field electrode so that the refractive index may be adjusted in the spatial area via the field electrode.

In this respect, it is particularly favorable when the field electrodes are arranged on oppositely located flat sides of the waveguide plate including the spatial area.

In this respect, the waveguide plate has the additional advantage that it creates the possibility of arranging the field electrodes at as slight a distance as possible from one another and, therefore, of keeping the fields which are required for influencing the refractive index in the electro-optical material as small as possible.

In this respect, it is particularly favorable when the first field electrode is formed by electrode material applied directly to the first flat side of the waveguide plate.

Furthermore, it is favorable when the second field electrode is formed by electrode material applied directly to the second flat side of the waveguide plate.

As a result, it is possible to arrange the field electrodes with the smallest possible distance from one another and, therefore, to operate with voltages which are as low as possible.

With respect to the determination of the shape of the spatial area, no further details have been given in conjunction with the preceding explanations concerning the embodiments. In this respect, the most varied of solutions are conceivable.

One preferred development of the inventive solution provides for a shape of the spatial area to be determinable by determining a spatial course of an electric field passing through the waveguide plate. This possibility is based on the effect that the refractive index in an electro-optical material may be altered by an electric field, wherein none of the areas of the electro-optical material which do not have the electric field passing through them are altered in the refractive index.

As a result, the shape of the spatial area may be determined solely by the course of the field.

The course of the field may be determined particularly easily when the electric field is defined by the shape of the first field electrode.

In principle, it would be conceivable to shape the second field electrode in accordance with the first field electrode. For reasons of simplicity it is of advantage, especially in the case of the small distances which can be realized with a waveguide plate, when the second field electrode extends beyond the spatial area and so it need not be shaped identically to the first field electrode.

Alternatively or in addition thereto, a further embodiment provides for the shape of the spatial area to be determined by determining a spatial shape of at least one domain area in the electro-optical material of the waveguide plate which is polarized spontaneously and electrically.

In this case, it is unnecessary to shape the field electrodes in accordance with the spatial area but rather the field electrodes can extend beyond the domain area for reasons of simplicity.

In principle, the starting point in conjunction with the deflection of the laser radiation in the respective deflection unit was at least one spatial area. In order to increase the efficiency of the deflection or improve the quality of the deflection it is of advantage when each deflection unit comprises several spatial areas with a refractive index variable electro-optically.

In this respect, the spatial areas are preferably arranged so as to follow one another in the direction of propagation of the respective laser radiation.

In principle, it is possible to arrange the several spatial areas in different waveguide plates. One particularly expedient solution does, however, provide for the several spatial areas to be arranged in the same waveguide plate.

A particularly favorable solution provides, in addition, for the deflection unit to offset the laser radiation so as to be essentially parallel in deflection direction by means of two spatial areas acting in opposite directions so that, in this respect, no additional deformation of the laser radiation whatsoever takes place, in particular, in the subsequent optical focusing means.

With respect to the design of the beam-deflecting spatial area, no further details have been given in conjunction with the preceding explanations concerning the individual embodiments.

In principle, a plurality of beam-deflecting spatial areas could be provided which all deflect individual areas of the laser radiation of a laser radiation unit, wherein spatial areas of this type need not be arranged in a connected manner in the waveguide plate.

A particularly simple embodiment provides, however, for the at least one beam-deflecting spatial area to widen or narrow like a wedge in deflection direction and to have the entire laser radiation passing through it.

A beam-deflecting spatial area of this type can likewise have the most varied of shapes. For example, this spatial area can be limited by surfaces which are flat, curved or also stepped and extend transversely to the direction of propagation of the laser radiation, wherein a deflection of the laser radiation due to variation of the refractive index in the spatial area can be realized by means of a course of the two limiting surfaces extending transversely to the direction of propagation of the laser radiation which is of a wedge shape in the deflection direction.

For example, the spatial area could have limiting surfaces of such a type that a correction of the beam divergence or a special beam shaping takes place at the same time as the deflection.

A particularly simple solution does, however, provide for the beam-deflecting spatial area to be designed similar to a prism area. In this respect, a prism can be a basic shape of this spatial area which can be varied, in addition, by changes, for example, for the purpose of the beam shaping.

With respect to the propagation of the laser radiation in the waveguide plate, no further details have so far been given. It would, for example, be conceivable to simply guide the laser radiation, which is supplied to the waveguide plate, in particular, via a waveguide, through the waveguide plate, wherein a beam divergence would occur, as a result, transversely to the direction of propagation and parallel to flat sides of the waveguide plate.

For this reason, it is preferably provided for the laser radiation to propagate in the waveguide plate in deflection direction in a widened manner, for example, band-shaped and, therefore, the divergence can already be reduced as a result of the widening.

For this purpose, the laser radiation is preferably widened parallel to the deflection direction by means of a beam shaping unit.

A beam shaping unit of this type can either be arranged separately outside the waveguide plate. It is, however, particularly advantageous when the beam shaping unit is integrated into the waveguide plate.

In this respect, the beam shaping unit can be designed in the most varied of ways.

For example, it is conceivable to design the beam shaping unit such that it operates electro-optically, i.e., that beam shaping can be realized due to the generation of an electric field within a spatial area.

Another advantageous solution provides for the beam shaping unit to be designed as a GRIN lens.

With respect to the type of control of the deflection units, no further details have been given in conjunction with the preceding explanations concerning the individual embodiments.

One advantageous embodiment, for example, provides for the control to control the deflection units with a voltage corresponding to the required position of the exposure spot within the respective strip area. The voltage can, in this respect, be determined in the most varied of ways.

One advantageous embodiment provides for the voltage to be continuously variable. As a consequence, the exposure spot can be positioned at any optional location within the strip area.

Another solution provides for the voltage to be variable in discrete steps which results in the exposure spot being positionable at specific locations within the strip area only in accordance with the discrete steps of the voltage.

In the case of deflection units with several spatial areas, additional activation possibilities are conceivable.

One advantageous embodiment, for example, provides for the refractive index to be variable synchronously in the case of several spatial areas of one deflection unit, i.e., the individual spatial areas of a deflection unit are controlled synchronously.

In the case of the synchronous activation, the voltage can still be adjusted variably, i.e., with optional voltage values between the minimum value and the maximum value; it is, however, also conceivable to adjust the voltage in discrete steps.

An alternative embodiment in the case of deflection units with several spatial areas provides for the refractive index to be controllable individually in the case of the several spatial areas of one deflection unit, i.e., for each spatial area to be activatable individually and, therefore, the refractive index to be adjustable individually in each spatial area.

In this case, it is likewise possible to configure the voltage so as to be variably adjustable in each spatial area, i.e., between a minimum value and a maximum value with optional intermediate values or to provide discrete steps for the voltage.

An additional simplification results, however, in the case of the individual activation of the individual spatial areas when the spatial areas are activatable with discrete voltage values, i.e., for example, in predetermined steps.

The simplest case of using discrete voltage values provides for the individual spatial areas to be controlled either free from voltage or with a predetermined voltage value. This means that in this case the spatial area is either controlled or not so that its deflection effect is either used or not.

For example, in the case of N spatial areas of a deflection unit N+1 positions of the exposure spot can be determined, namely a position determined by way of the activation of none of the spatial areas and then successively, in addition, N positions by way of the successive activation of one additional spatial area each time so that the maximum deflection can be achieved when all N spatial areas are controlled.

In all the types of activation of the deflection units described thus far, no details have been given as to how the activation of the deflection units is brought about in conjunction with the control of the intensity of the laser radiation sources.

It would, for example, be conceivable in one embodiment to configure the activation of the deflection units such that the exposure spot is positioned within the strip area during the course of the movement of the exposure spot in the exposure movement direction and in the deflection direction and when the exposure spot is located within a conversion area an exposure is brought about in this exposure spot due to control of the intensity of the laser radiation source.

In this respect, it is possible to expose continuously for as long as the exposure spot is located in a conversion area. Alternatively thereto, it is, however, also conceivable to expose in a pulsed manner for as long as the exposure spot is located in the conversion area.

It is, however, also conceivable to control the deflection units simultaneously during the movement in the exposure movement direction such that the exposure spot is moved constantly back and forth between a minimum and a maximum position in the strip area, for example, in accordance with a periodic function and an exposure is then brought about by way of control of the intensity of the laser radiation source when the exposure spot has reached the position within the strip area in deflection direction which is desired on account of the periodic function.

This solution has the advantage that, as a result, a stable voltage source for the deflection units can be used and for example, it is even possible to control all the deflection units synchronously to one another and to switch the respective laser radiation source to pulsed operation when the desired location is reached.

Additional features and advantages of the invention are the subject matter of the following description as well as the drawings illustrating several embodiments.

Figure 1:
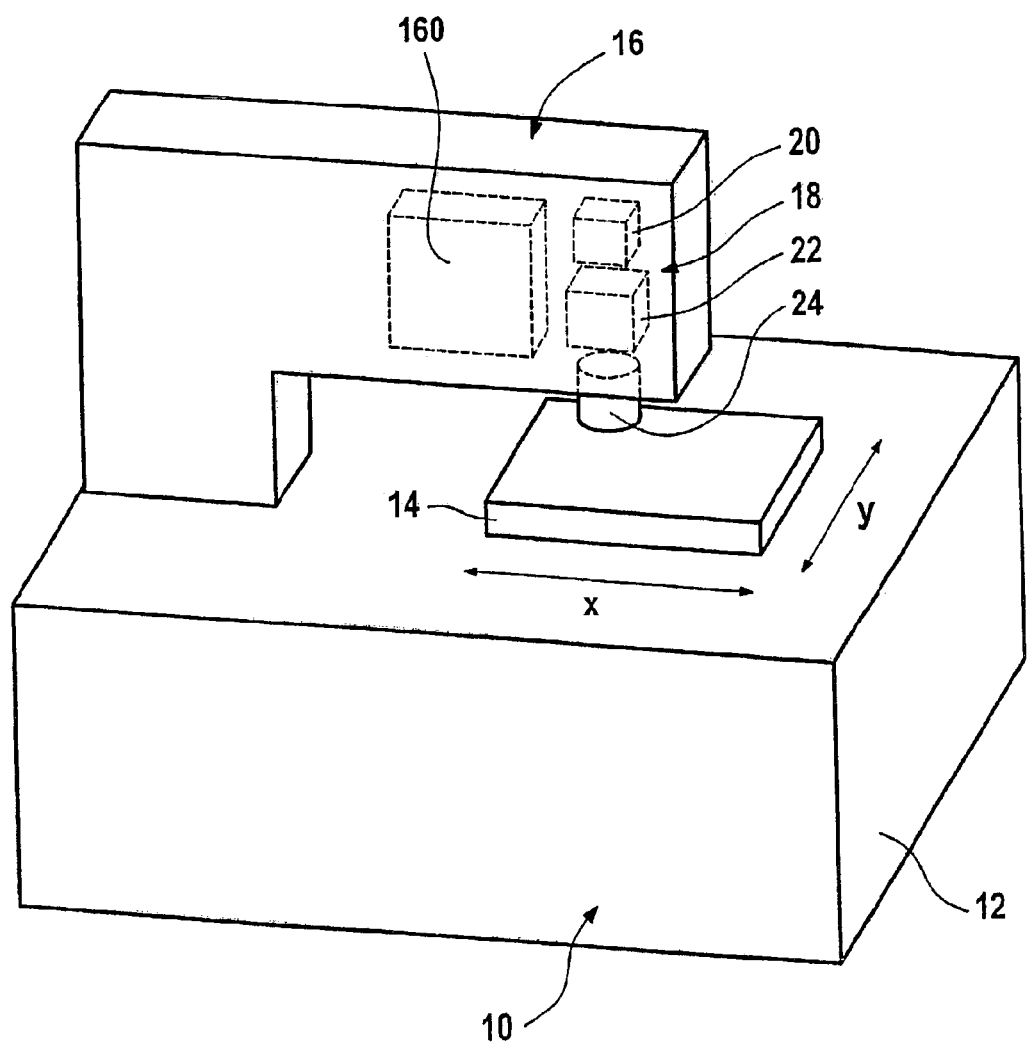
FIG. 1 shows a fundamental schematic construction of an inventive lithography exposure device.

One embodiment of an inventive lithography exposure device, illustrated in FIG. 1, comprises a machine frame designated as a whole as 10 with a base member 12, on which a table 14 is mounted so as to be movable by means of a drive, which is not illustrated, in two directions extending at right angles to one another, for example, an X direction and a Y direction.

Figure 2:
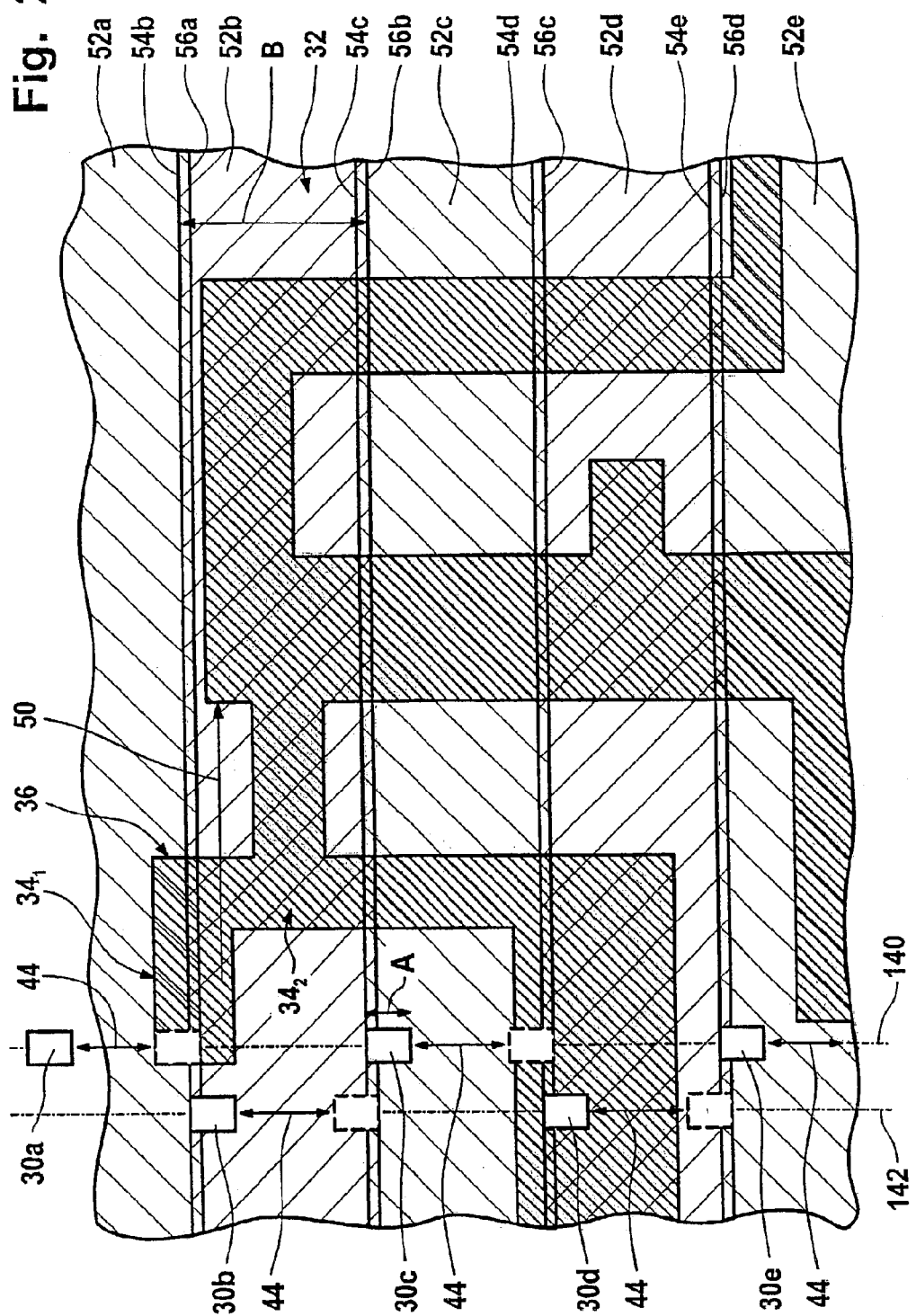
FIG. 2 shows a schematic illustration of exposed structures which can be produced with the inventive lithography exposure device and the image spots used for this purpose.
Figure 3:
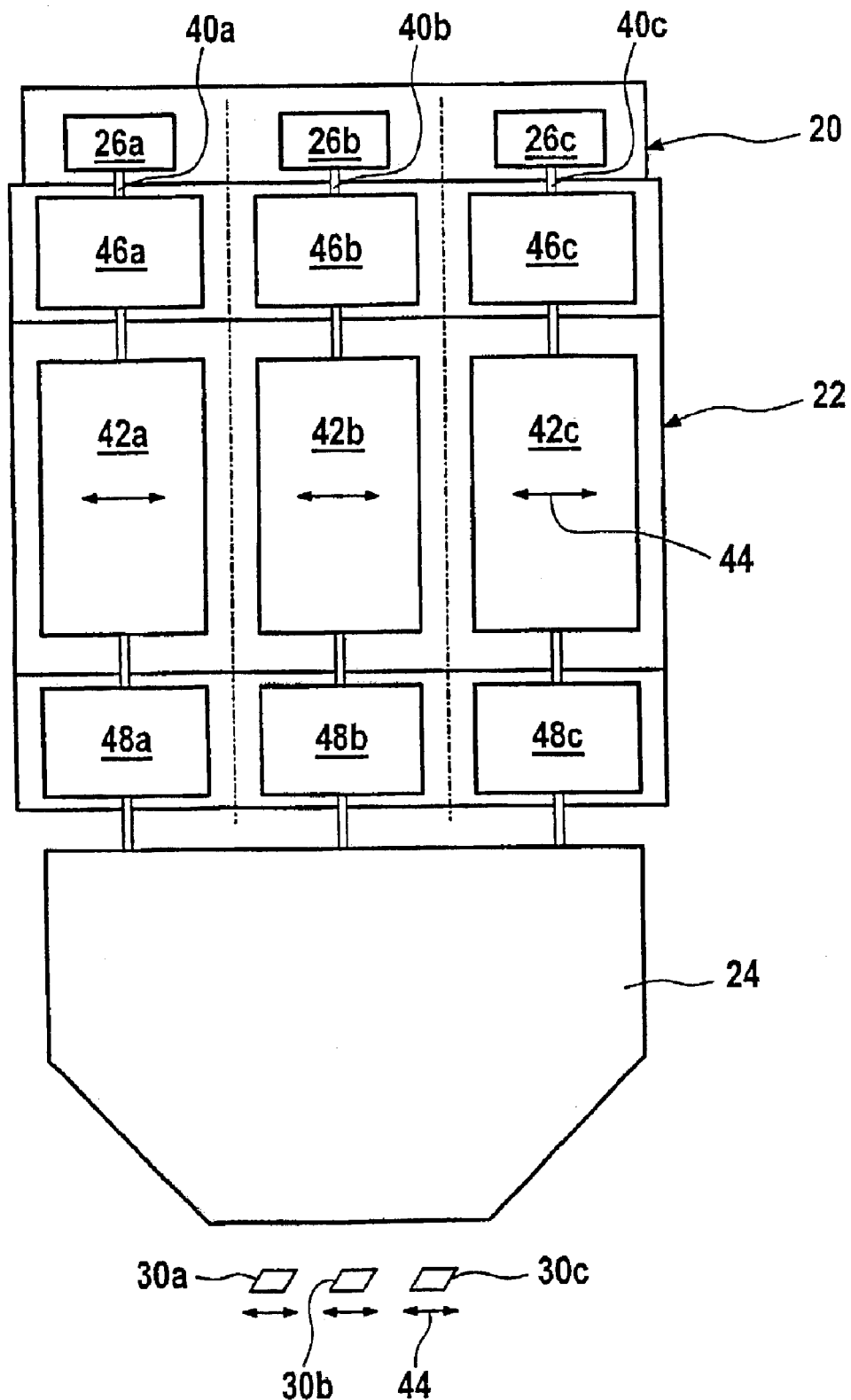
FIG. 3 shows a schematic illustration of the construction of an inventive lithography exposure device summarized in blocks.

An arm 16 extending over the table 14 and at a distance from it rises above the base member 12, an exposure unit 18, which has a plurality of laser radiation sources combined in a radiation source unit 20, being arranged in this arm, as illustrated schematically in FIG. 1. A deflection device designated as a whole as 22 adjoins this radiation source unit 20 and this is followed by an optical focusing means which is designated as a whole as 24 and, in the end, images the laser radiation of each laser radiation source 26 as an exposure spot 30 onto a light-sensitive layer 32 which is arranged on the table 14 and applied to a carrier in order to generate in the light-sensitive layer 32 conversion areas 34, in which the light-sensitive layer 32 is converted from an initial state into an end state and which result altogether in an exposed structure 36 (FIGS. 2, 3). The deflection device 22 and the optical focusing means 24 are also part of the exposure unit 18.

As illustrated again in FIG. 3 in detail but still schematically, the radiation source unit 22 comprises a plurality of laser radiation sources 26 which can, for example, be semiconductor diode lasers or semiconductor lasers with an associated, light-linear, optical frequency conversion, i.e., frequency doubling.

The laser radiation 40 generated by the individual laser radiation sources 26 is supplied to the deflection device designated as a whole as 22 either in the form of a free beam propagation or via light guides.

The deflection device 22 comprises for the laser radiation 40 of each of the laser radiation sources 26 a respective deflection unit 42, with which the laser radiation 40 can be deflected in a deflection direction 44, as will be described in the following in detail.

Furthermore, a beam shaping unit 46 is provided between each of the laser radiation sources 26 and the corresponding deflection units 42.

Furthermore, a beam shaping unit 48 is likewise provided between each of the deflection units 42 and the optical focusing means 24 and this unit serves, for example, to generate bundles of laser radiation which are approximately rotationally symmetric prior to their entry into the optical focusing means 24.

The optical focusing means 24 generates, for its part, in the light-sensitive layer 32 the individual image spots 30 associated with each of the laser radiation sources 26.

As illustrated in FIG. 2, during the exposure of the light-sensitive layer 32 the table 14 is moved with the light-sensitive layer 32 arranged thereon in an exposure movement direction 50 which can coincide, for example, with the X direction or the Y direction in FIG. 1 or can also result due to addition of a movement in X and Y directions.

Furthermore, the exposure movement direction 50 always extends such that the deflection directions 44, in which the laser radiation can be deflected, extend transversely to the exposure movement direction 50, wherein a course at right angles is not absolutely necessary but rather a slightly inclined position is likewise possible.

As a result of the deflection of the laser radiation 40 in the direction of the deflection directions 44, the exposure spot 30 resulting from the respective laser radiation 40 can be displaced on the light-sensitive layer 32 likewise in the deflection direction 44, namely between an extreme position shown as a solid line in FIG. 2 and an extreme position shown as a dashed line in FIG. 2, wherein both extreme positions determine a width B of strip areas 52, within which conversion areas 34 can be generated in the light-sensitive layer 32 with the respective exposure spot 30. The width B corresponds to a multiple of an extension A of the respective exposure spot 30 in the deflection direction 44.

The strip areas 52 are preferably arranged such that their outer edges 54 and 56 overlap slightly in order to ensure that the conversion areas 34 generated by the exposure spot 30 associated with one of the strip areas 52 can be generated in an interconnected manner with the strip areas 52 generated by the exposure spot 30 associated with the next closest strip area 52.

For example, the conversion area $34_1$ can be generated as a continuous conversion area with the exposure spot 30a in the dashed position directly adjoining the edge 56a and the exposure spot 30b in its position directly adjoining the edge 54B.

Furthermore, the conversion area $34_2$ can be generated, for example, as a continuous conversion area not only with the exposure spot 34a in a position adjoining the edge 56a, the exposure spots 30b and 30c in all the positions located between the edges 54b and 56b as well as 54c and 56c and the exposure spot 30b in its positions located over somewhat more than half the strip area 52d proceeding from the edge 54d on account of the overlapping of the strip areas 52a, 52b, 52c and 52d.

Figure 4:
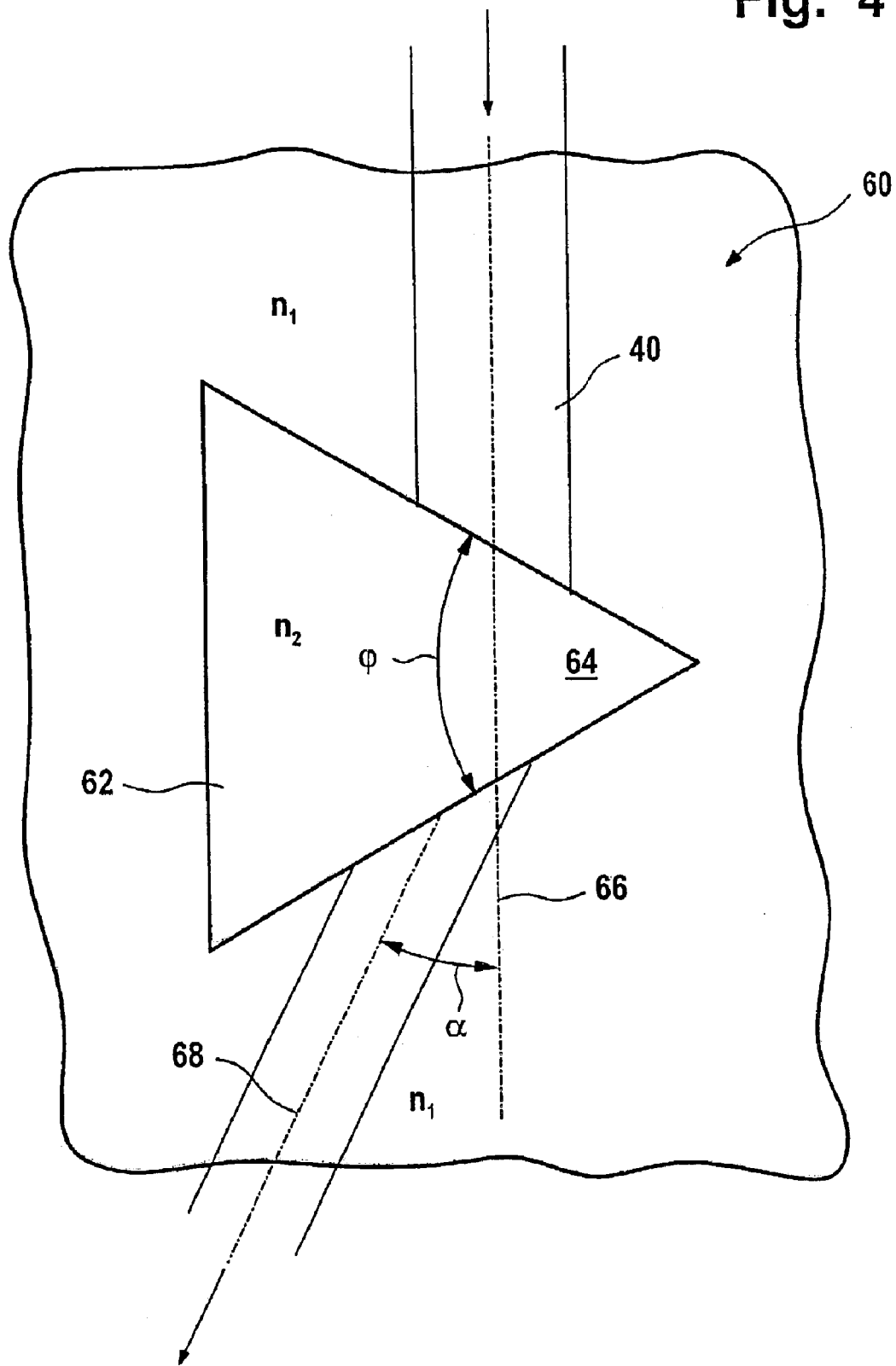
FIG. 4 shows a schematic illustration of a mode of operation of one embodiment of a deflection unit of an inventive lithography exposure device.

The individual deflection units 42 operate in the inventive lithography exposure device in accordance with the following principle:

After passing through the beam forming unit 46 which will be described in detail in the following, the laser radiation 40 coming from the respective laser radiation source 26 passes through a first medium 60 which has the refractive index $n_1$. From the first medium 60, the laser radiation 40 passes into a beam-deflecting spatial area 62, which is designed, for example, as a prism or half a lens and within which a second medium 64 has a variable, adjustable refractive index $n_2$ which is greater than $n_1$, and again passes into the first medium with the refractive index $n_1$ after passing through the spatial area 62 (FIG. 4).

As a result, the laser radiation 40 is deflected by the spatial area 62, on account of the refractive index $n_2$ of the second medium 64, from the original direction 66 into an exiting direction 68 which extends at an angle α in comparison with the original direction so that a deflection of the laser radiation 40 by the spatial area 62 takes place.

The angle α thereby depends on the extent, to which the refractive index $n_2$ of the second medium 64 differs from the refractive index $n_1$ of the first medium 60, and so the angle α is also variable at the same time due to variation of the refractive index $n_2$.

In the case of a spatial area 62 designed as a prism, $\alpha : \alpha \approx (n_2 - n_1)\Phi$ applies for small angles, wherein $\Phi$ is the prism angle determining the prismatic spatial area 62.

Figure 5:
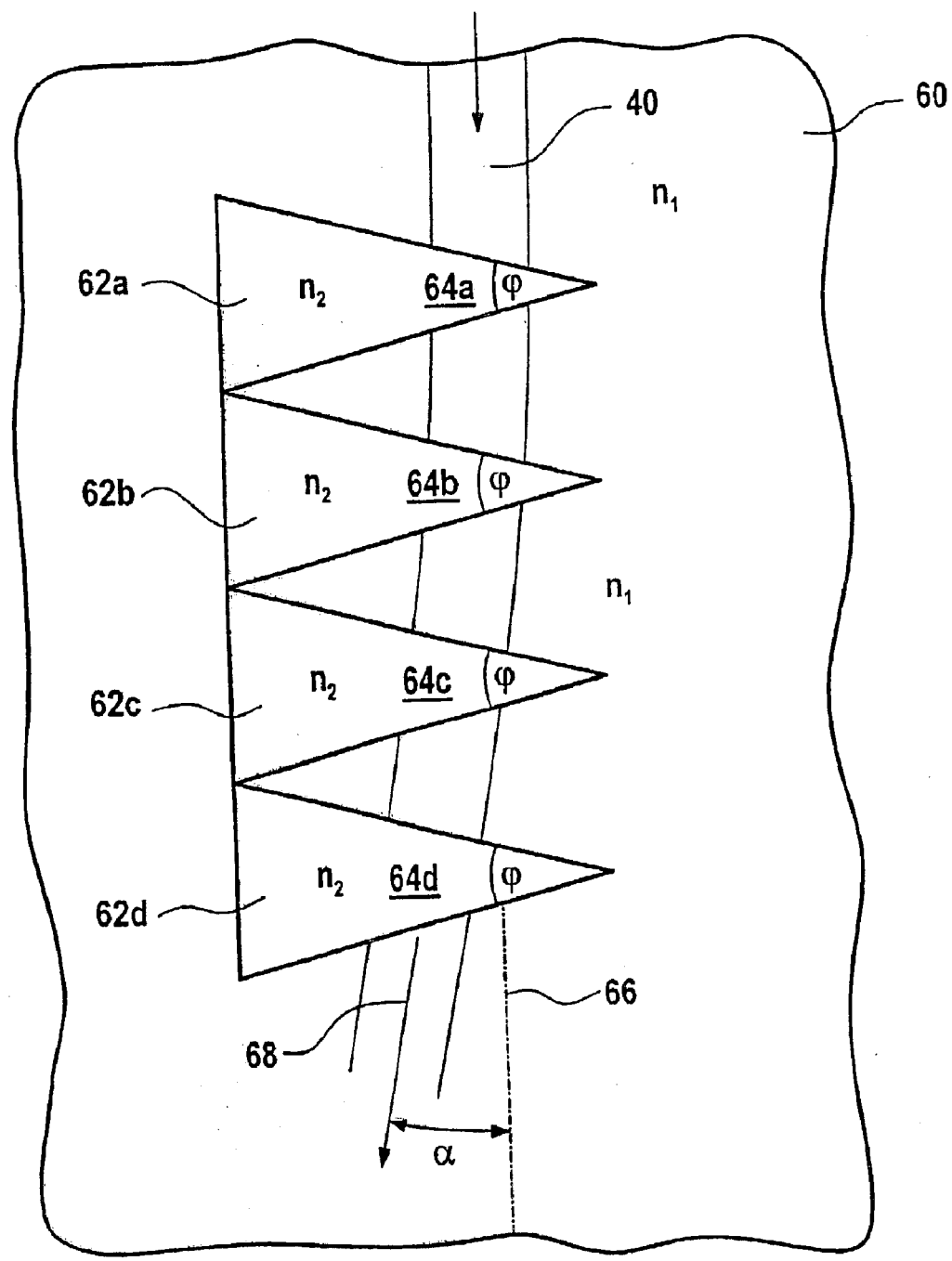
FIG. 5 shows a schematic illustration of a mode of operation of a deflection unit of an inventive lithography exposure device modified in comparison with FIG. 4.

The effectiveness of the spatial area 62 may be increased further when, as illustrated in FIG. 5, several consecutive spatial areas 62a to 62b, each consisting of the second medium, are used, through which the laser radiation 40 passes one after the other so that the deflection generated by each individual one of the spatial areas 62a to 62d may be added together and the exiting direction 68 extends altogether at an angle α in relation to the original direction 66 which represents the sum of the deflections achieved in each of the spatial areas.

Figure 6:
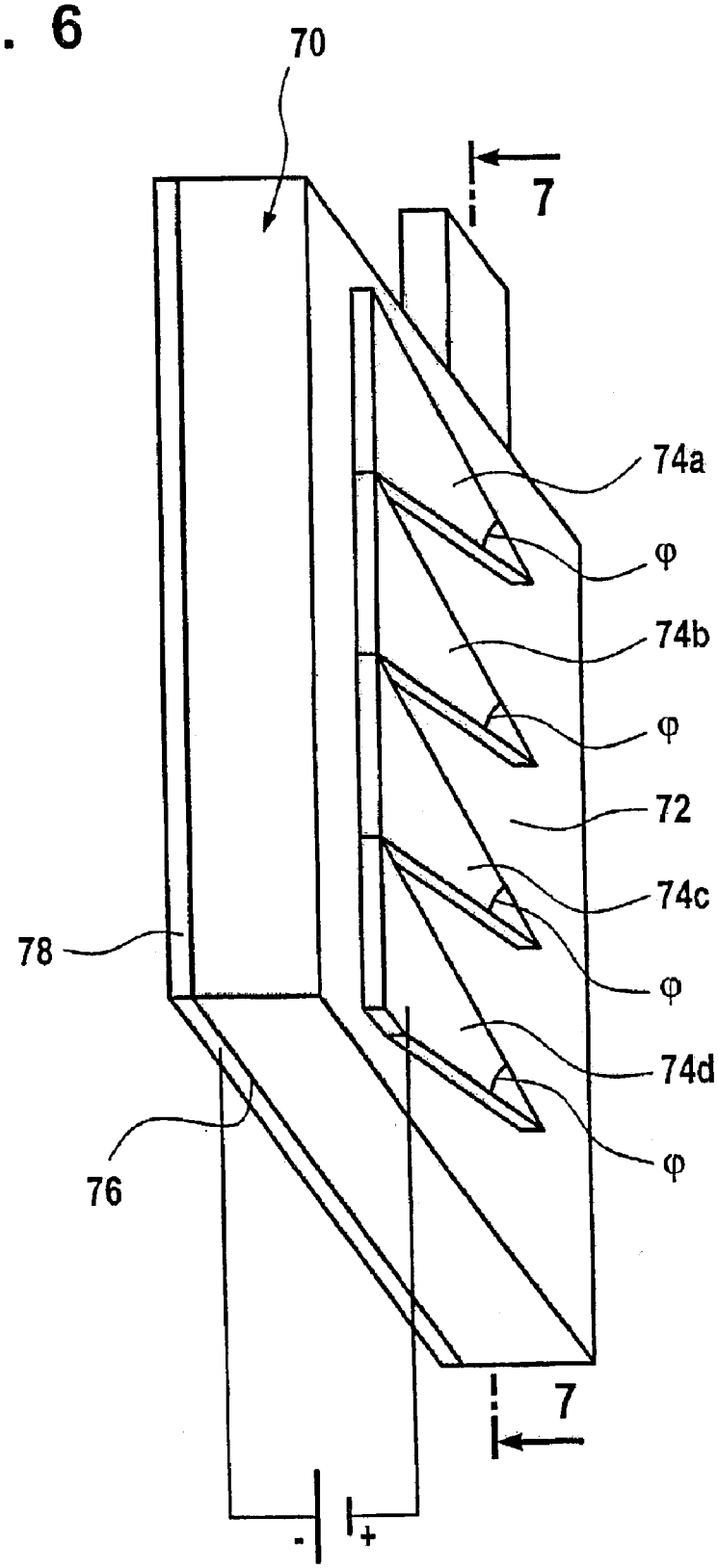
FIG. 6 shows a schematic illustration of a realization of a first embodiment of the inventive lithography exposure device.
Figure 7:
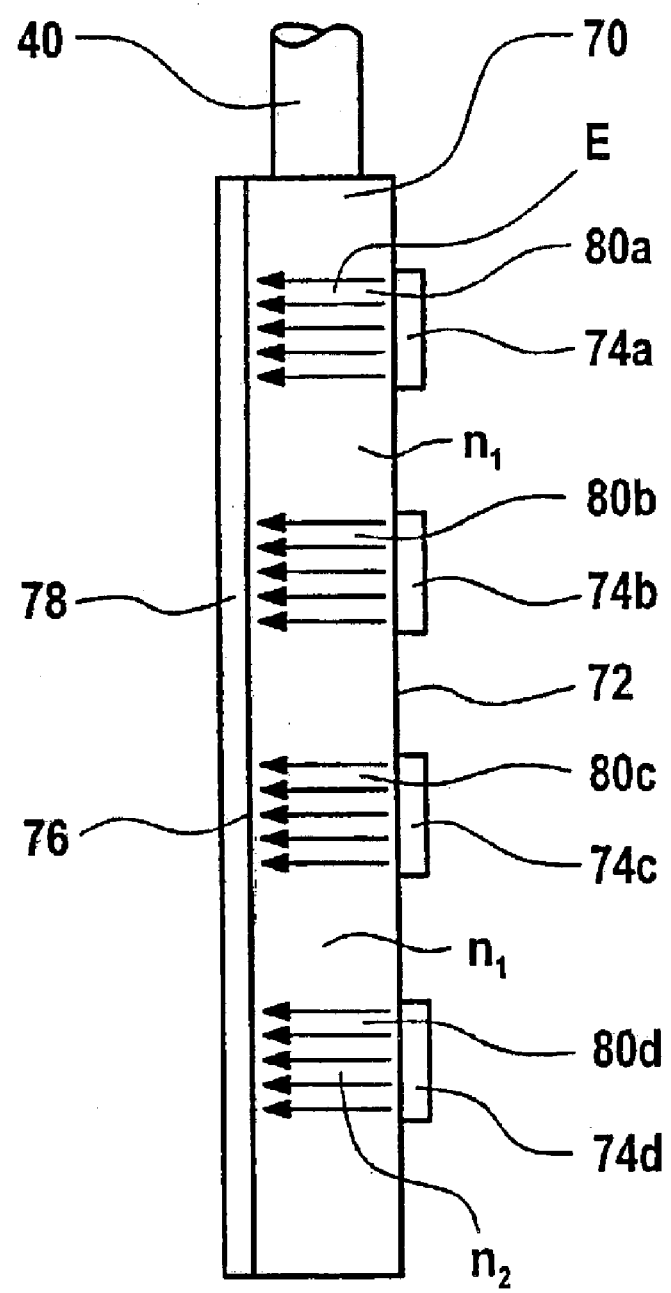
FIG. 7 shows a section along line 7—7 in FIG. 6.

Beam-deflecting spatial areas 62 of this type may be realized as follows:

In a first embodiment of an inventive deflection device, illustrated in FIG. 6 and FIG. 7, a waveguide plate 70 is provided on a first side 72 with a set of first electrodes 74a to 74d which are connected to one another so as to be electrically conductive and have a prism shape with the prism angle Φ.

Furthermore, a second side 76 located opposite the first side 72 is provided, for example, with a second, continuous electrode 78.

If the waveguide plate 70 is produced from an electro-optical material, such as, for example, lithium metaniobate, lithium tantalate, or from a polar semiconductor, such as aluminum-gallium-nitride, an electric field E can be generated between the first electrode 74 and the second electrode 76 when an electric voltage is applied to the first electrode 74 and the second electrode 78, this electric field passing through volume areas 80a to 80d in the waveguide plate 70 which have a shape of a prismatic spatial member on account of the prismatic shape of the first electrode 74.

On account of the electro-optical properties of the material of the waveguide plate 70, this has a refractive index $n_1$ outside the volume areas 80a to 80d whereas within the volume areas 80a to 80d the refractive index $n_1$ can be altered due to the effect of the electric field E and has a refractive index $n_2$ which differs from the refractive index $n_1$ depending on the magnitude of the electric field E.

As a result, proceeding from the state that no electric voltage is present at the electrodes 74 and 78 and, therefore, no electric field E occurs in the volume areas 80 so that, consequently, $n_1=n_2$ and, therefore, the laser radiation 40 does not experience any deflection and propagates in an unaltered manner in the original direction 66 through the waveguide plate 70, an increasingly larger electric field E can be generated at the electrodes 74 and 78 with an increasing voltage and so the refractive index $n_2$ may be adjusted in the volume area 80 in accordance with the electric field E, whereby—as already explained—the angle α between the original direction 66 and the exiting direction 68 can again be adjusted.

The deflection may be adjusted in the case of several beam-deflecting spatial areas 62 either due to the fact that the voltage between the electrodes 74 and 78 is adjusted variably.

On the other hand, it is, however, also conceivable in the case of several spatial areas 62 to control these individually and, proceeding from a predetermined voltage level, to control either none of the spatial areas 62 or successively an ever increasing number of spatial areas with the voltage with the predetermined voltage level and, therefore, to increase the deflection of the laser radiation in steps.

Figure 8:
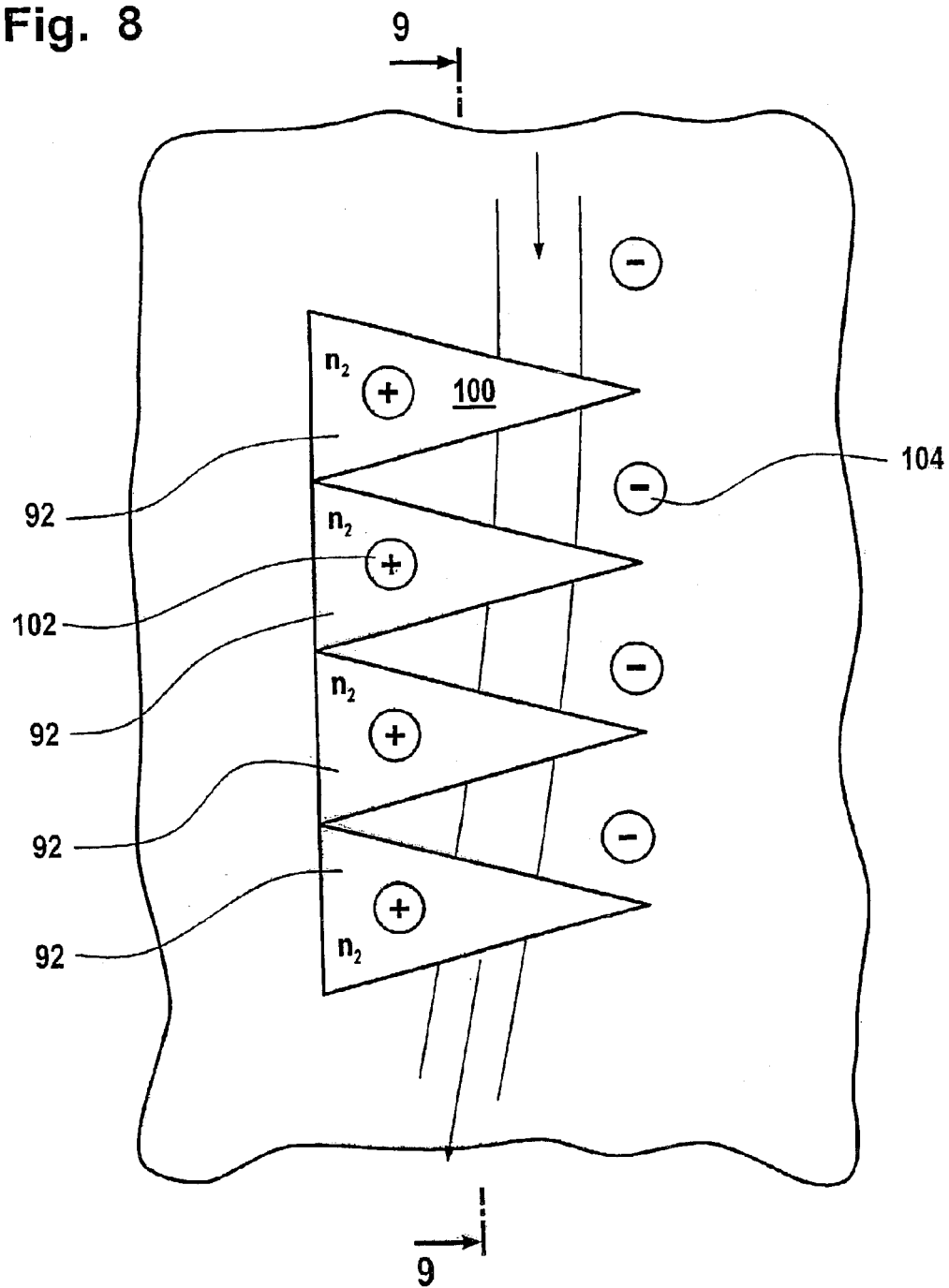
FIG. 8 shows a schematic illustration similar to FIG. 5 of a second embodiment of a deflection unit of an inventive lithography exposure device.
Figure 9:
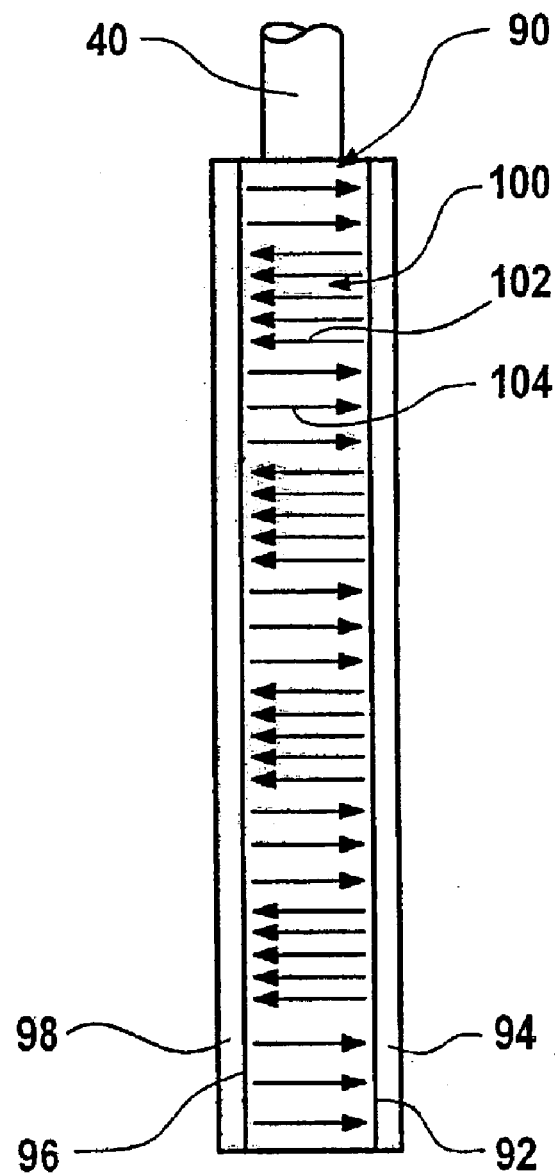
FIG. 9 shows a section along line 9—9 in FIG. 8.

A second embodiment of an inventive deflection unit 42 provides, for the design of spatial areas 62 as illustrated in FIG. 8 and FIG. 9, for a waveguide plate 90 to likewise be produced from an electro-optical material but with a domain structure.

The waveguide plate 90 bears on its first side 92, in the same way as in the first embodiment, a first electrode 94 which does, however, cover this entire side and on a second side 96 a second electrode 98 covering this entire side.

Furthermore, volume areas 100 are present within the waveguide plate 90, in which domains of the electro-optical material with a polarization 102 are present, whereas continuous areas forming, altogether, one domain with a second polarization 104 are present outside the volume areas 100, this polarization being aligned in exactly the opposite direction to the first polarization 102.

The first volume areas 100 with the first polarization 102 and the areas with the second polarization 104 have the same refractive index $n_1$ without any electric field E being applied.

Depending on the voltage between the electrodes 94 and 98, the refractive index may be reduced either in the area of the first polarization 102 or of the second polarization 104 proceeding from its initial state, wherein the respective refractive index in the area of the other polarization 104 and 102, respectively, is increased on account of the electrodes 94 and 98 engaging over all the domains.

As a result, the difference between the refractive indices of the domains with the polarizations 102 and 104 can be adjusted by applying the electric field to the electrodes 94 and 98.

In all the embodiments of deflection units 42 operating electro-optically, the laser radiation 40 is preferably to be selected so as to be polarized and aligned such that it extends parallel to the electric field E which can be applied.

Figure 10:
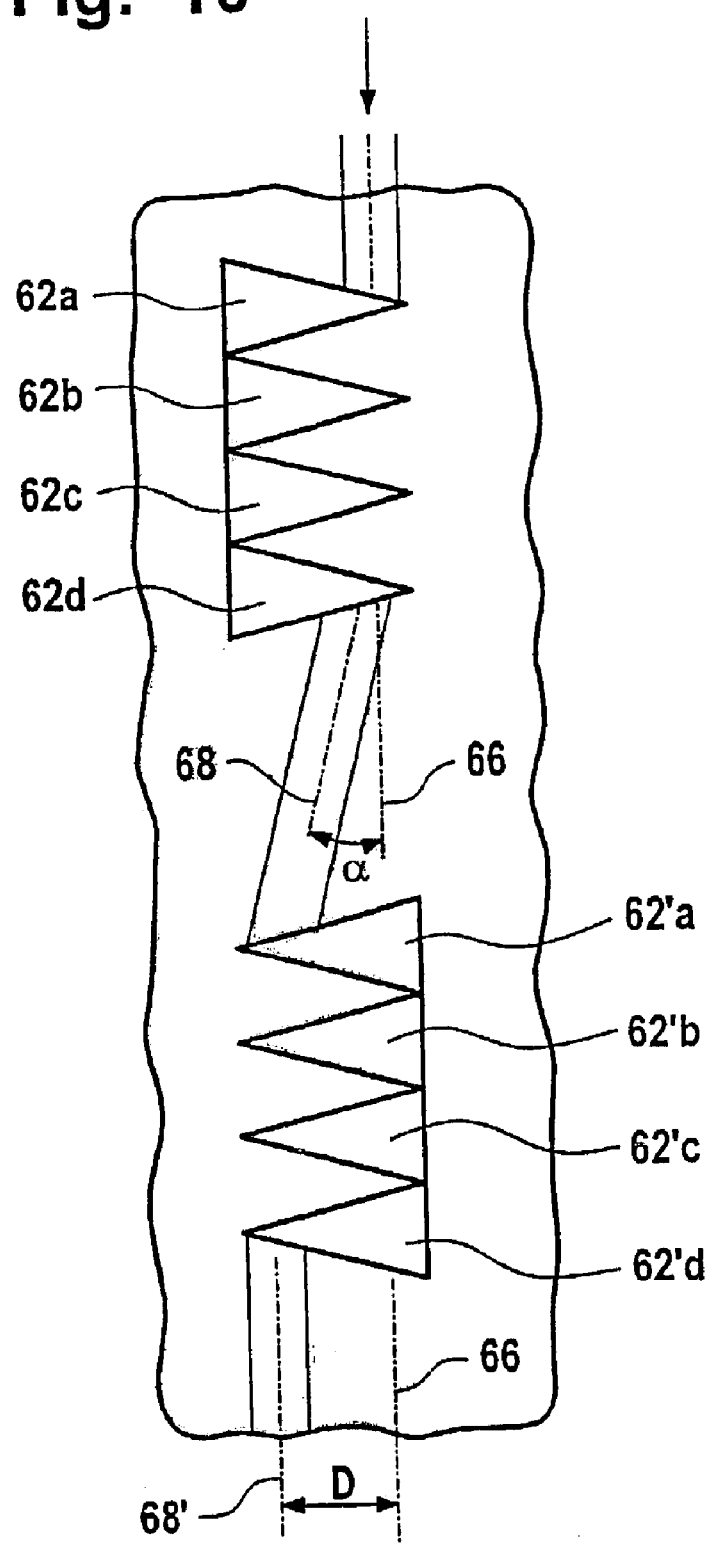
FIG. 10 shows an illustration similar to FIG. 5 of a third embodiment of a deflection unit of an inventive lithography exposure device.

Since, not only in the case of the embodiment according to FIGS. 6 and 7 but also in the case of the embodiment according to FIGS. 8 and 9, the laser radiation 40 extends in the exiting direction 68 at an angle to the original direction 66 after passing through the prism areas 62a to 62d, spatial areas 62'a to 62'd having a complementary effect are preferably provided, in addition, in a further embodiment according to FIG. 10 and these spatial areas again deflect the laser radiation 40 through an angle α in the opposite direction so that, in the end, the exiting direction 68' extends parallel to the original direction 66 but offset in relation to it by a distance D after passing through the spatial areas 62a to 62d and the complementary spatial areas 62'a to 62'd.

As a result, the laser radiation 40 propagating in exiting direction 68' can be imaged into the exposure spot 30 by the optical focusing means 24 without any additional measures on account of an inclined incidence.

No details concerning the operation of the beam shaping units 46 have been given in conjunction with the preceding explanations concerning the individual embodiments.

Figure 11:
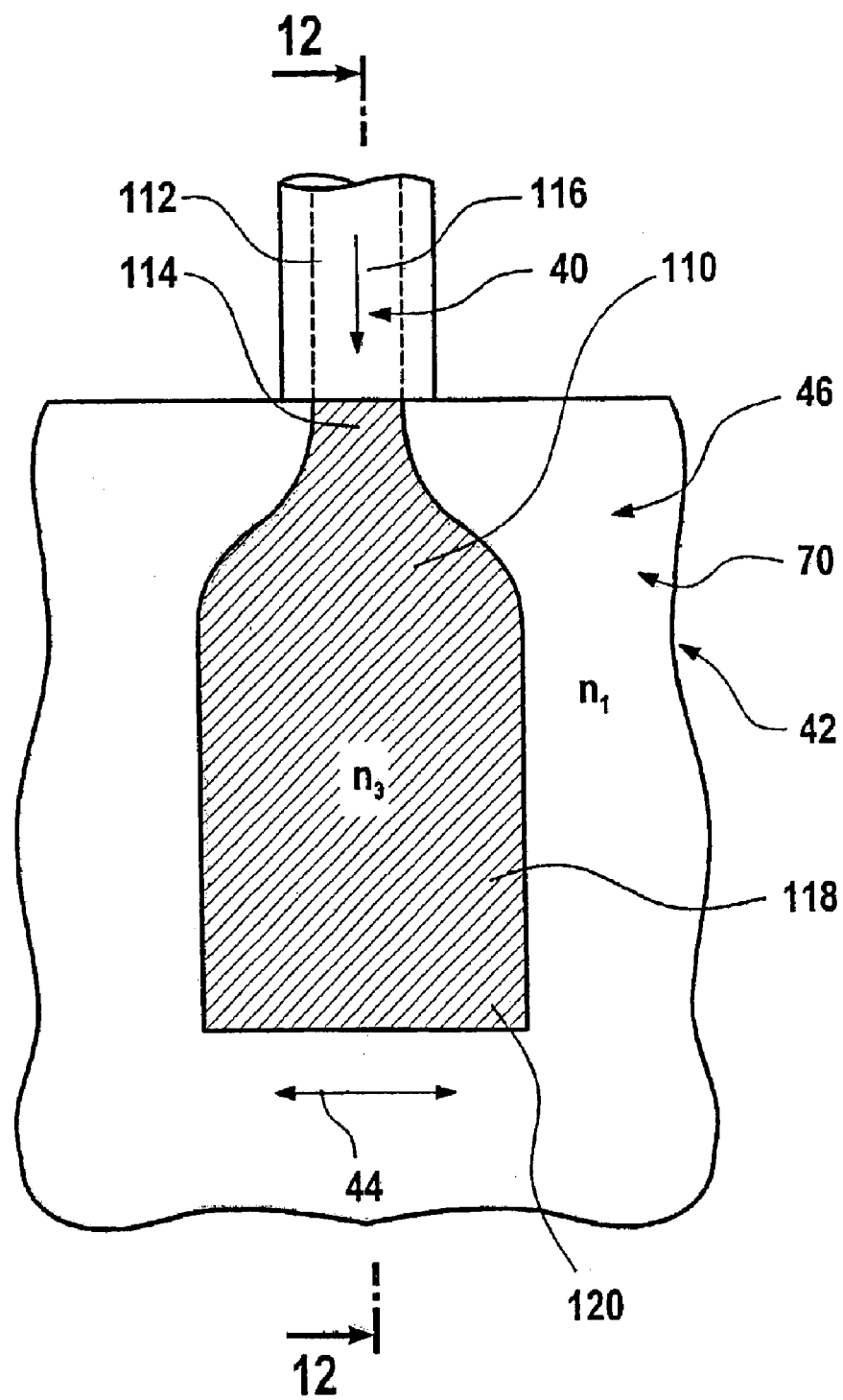
FIG. 11 shows a schematic illustration of a first embodiment of an inventive beam shaping unit.

In order to limit the divergence of the incoming laser radiation 40 in the deflection direction 44, a spatial area 110 which guides the laser radiation 40 and has the refractive index $n_3$ is provided, for example, in the waveguide plate 70 which has the refractive index $n_1$ (FIG. 11).

This spatial area 110 guiding the laser radiation 40 has a connection area 114 which adjoins a waveguide 112 guiding the laser radiation, is adapted in deflection direction 44 to the extension of a core area 116 in deflection direction 44 and then, proceeding from the connection area 114, widens into a band-like area 118, the extension of which in deflection direction 44 is more than ten times, preferably more than twenty times, the extension of the connection area 114. The extension of the band-like area 118 in deflection direction 44 is, for example, between more than ten times and more than fifty time the extension of the connection area 114.

As a result of the band-like area 118 it is possible to guide the laser radiation 40, after exiting from an end 120 of the band-like area 118 in the waveguide plate 70, with a divergence which is clearly less than the maximum displacement of the laser radiation 40 in deflection direction 42 by the respective deflection unit 42.

In this respect, each of the deflection units 42 is preferably provided with its own beam shaping unit 46 which is integrated into the waveguide plate 70 of the deflection unit 42.

Figure 12:
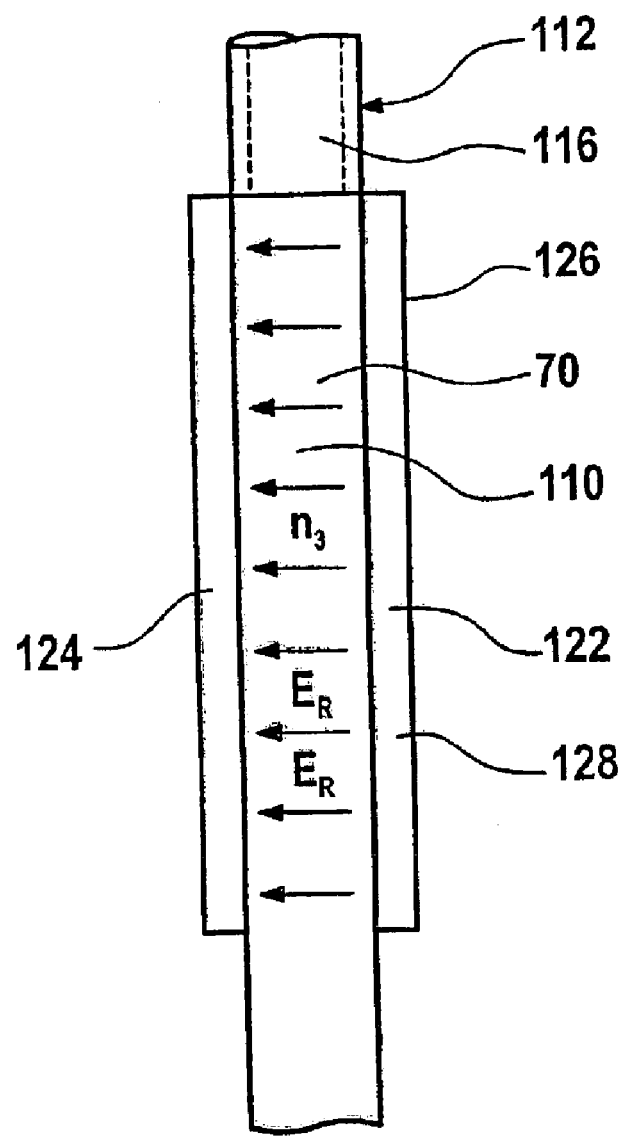
FIG. 12 shows a section along line 12—12 in FIG. 11.

The spatial area 110 with the refractive index $n_3$ may preferably be generated in the waveguide plate 70 in that, as illustrated in FIG. 12, electrodes 122 and 124 are provided on oppositely located sides of the spatial area 110 and with these electrodes an electric field $E_r$ can be generated in the waveguide plate 70 consisting of electro-optical material which leads to a change in the refractive index $n_1$ to the refractive index $n_3$. In this respect, one of the electrodes 122 or 124 is preferably shaped in accordance with the extension of the spatial area 110 in deflection direction 44, i.e., the electrode 122, for example, has a section 126 which is adapted in deflection direction 44 to the core area 116 of the waveguide 112 and widens in deflection direction 44 towards a section 128 determining the band-like area 118 of the spatial area 110.

The other electrode 124 can either be shaped in accordance with the electrode 122 or extend over the entire waveguide plate 70 and form a unit, for example, with the second electrode 78.

Figure 13:
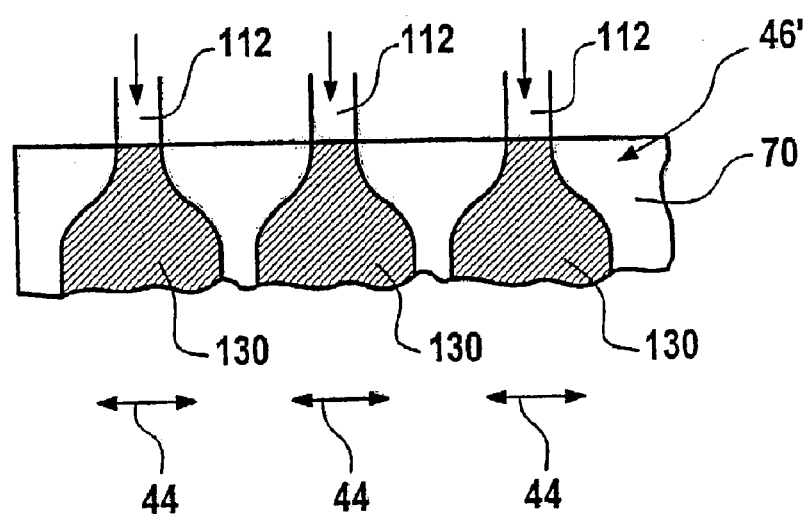
FIG. 13 shows a schematic illustration of a second embodiment of an inventive beam shaping unit.

Alternatively to the design of the spatial area 110 by way of generation of the electric field $E_r$, it is provided in another embodiment of the inventive beam shaping unit 46 for GRIN lenses 130 to be provided in the waveguide plate 70 adjoining the waveguide 112, these lenses likewise effecting a widening of the laser radiation in deflection direction 44 as a result of a refractive index varying symmetrically to a central axis in such a manner that the divergence of the laser radiation propagating in the waveguide plate 70 is smaller than the maximum deflection of the laser radiation which can be generated by the deflection unit 42 (FIG. 13).

GRIN lenses of this type may preferably be generated by way of diffusion of substances varying the refractive index in the waveguide plate 70.

The beam shaping units 46 described in conjunction with the integration into the waveguide plate 70 may, however, also be realized in the same way in the waveguide plate 90 or in other embodiments.

Figure 14:
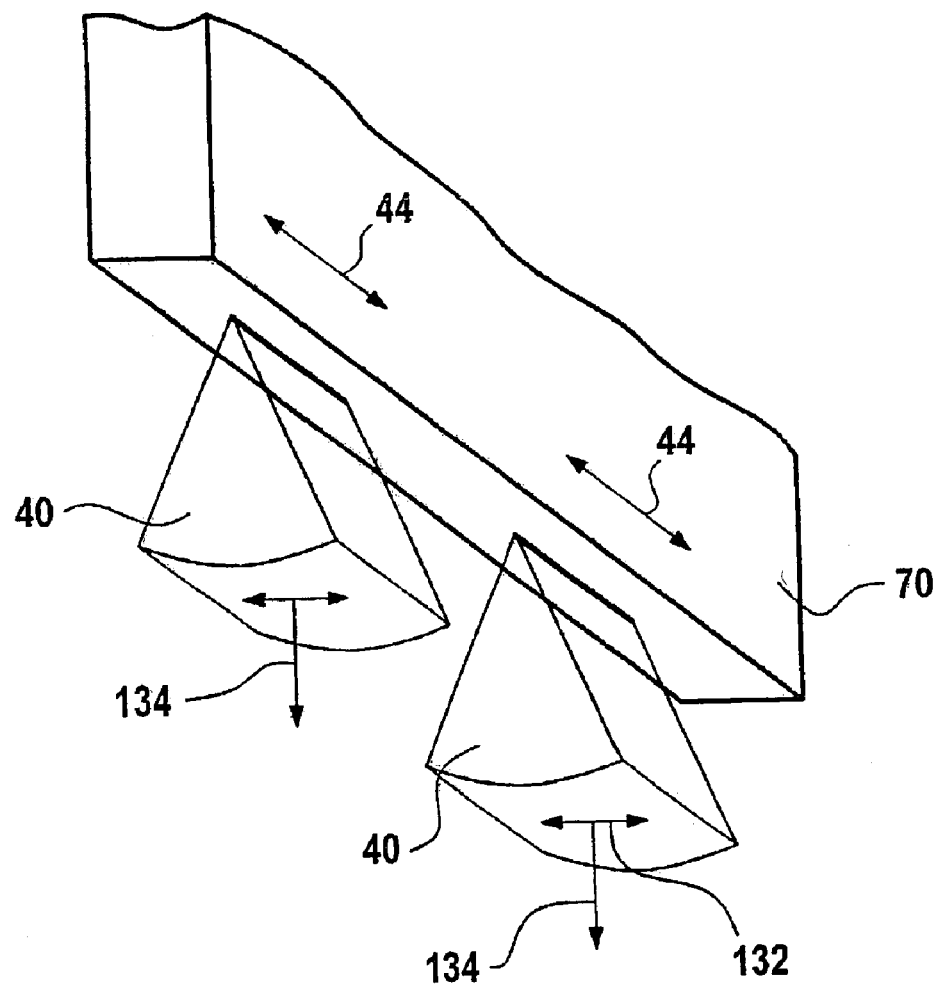
FIG. 14 shows a schematic illustration of the divergence of the laser radiation exiting from a waveguide plate of an inventive deflection unit.
Figure 15:
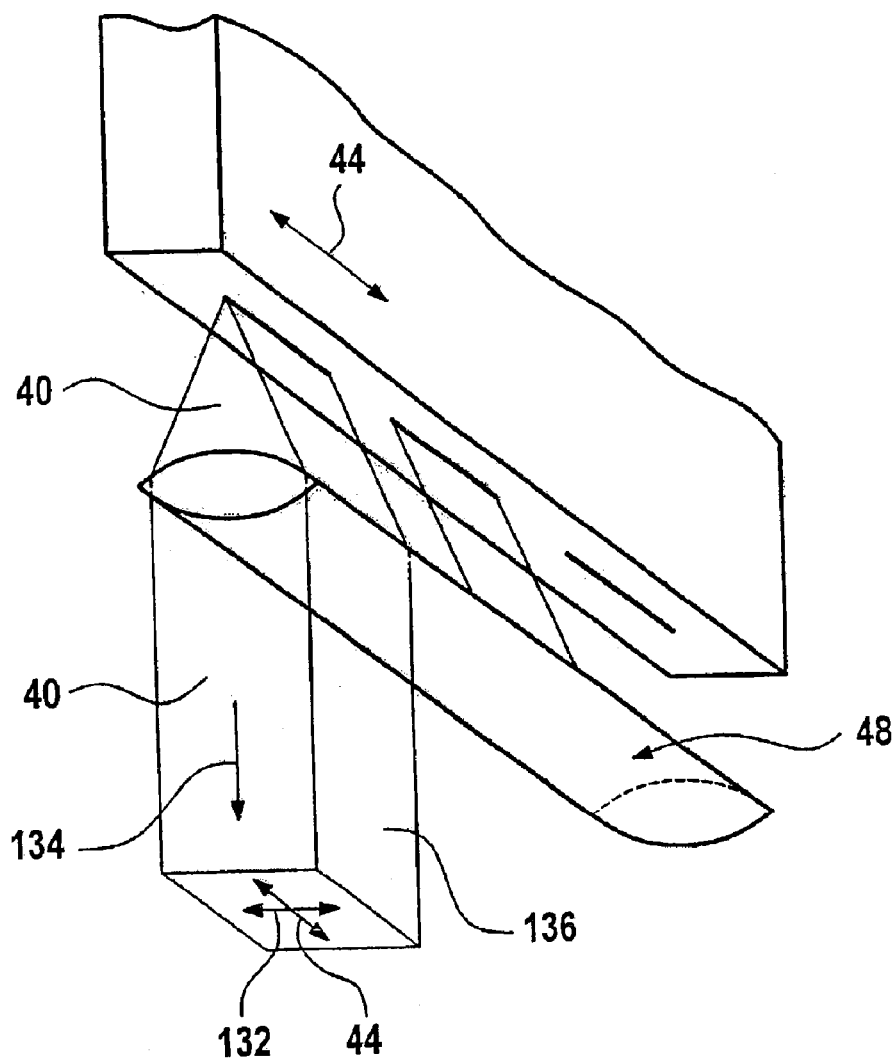
FIG. 15 shows a schematic illustration of a beam shaping unit for shaping a bundle of beams entering the optical focusing means.

Since the laser radiation 40 propagates through the deflection unit 42 in the shape of a band broadened in deflection direction 44 due to the beam shaping unit 46, the laser radiation exits from the waveguide plate 70, as illustrated in FIG. 14, in the shape of a band likewise broadened in the deflection direction 44 which leads to the laser radiation 40 propagating in a considerably divergent manner in a direction 132 transverse to its direction of propagation 134 and transverse to the deflection direction 44 after leaving the waveguide plate 70. For this reason, it is provided for a bundle of radiation 136 to be formed with the beam shaping optical means 48, illustrated in FIG. 15, from the respectively divergent laser radiation 40 and for this bundle to have approximately the same extension in the deflection direction 44 and the direction 132 transverse to the deflection direction 44. This bundle of radiation 136 may then be reduced in size in the optical focusing means 24 when this is of a conventional construction.

In a development of the deflection unit 42 in accordance with the embodiments described in the aforesaid, for example, the embodiment according to FIGS. 6 and 7, the problem is that the first, prism-like shape of the electrode 74 must always extend beyond the extension of the laser radiation in the deflection direction 44.

For this reason, it is advantageous not to arrange the deflection units 42a to 42d, which are associated with a series of strip areas 52a to 52d located next to one another, in one plane but rather in several planes, for example, in two planes 140 and 142.

Figure 16:
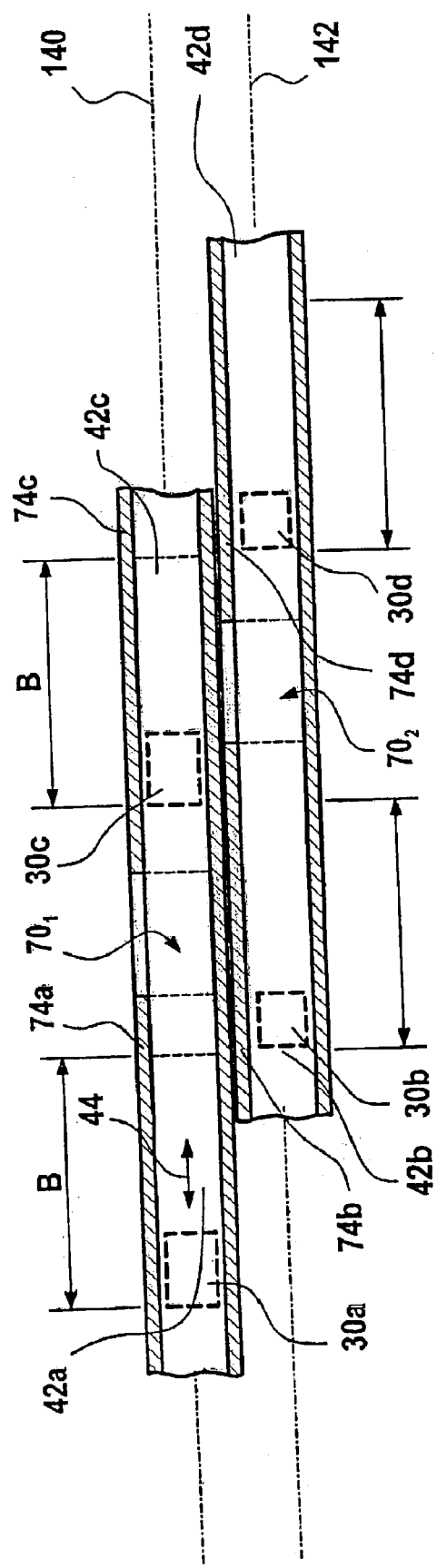
FIG. 16 shows a schematic sectional illustration through the arrangement of several deflection units in the inventive solution.

For example, the deflection units 42a and 42c, as illustrated in FIG. 16, i.e., the respectively next-but-one deflection units 42, are arranged in the plane 140 and the deflection units located therebetween, such as, for example, the deflection units 42b and 42d, parallel thereto in the second plane 142 extending relative thereto. This allows the first electrodes 74 to each be designed with the necessary size and, therefore, extension in deflection direction 44 beyond the laser radiation without these electrodes 74 which extend beyond the width B of the respective strip area 52 making a space between the strip areas 52 necessary.

As a result, there is sufficient space in the deflection direction 44 for the formation of the electrodes 74 and, nevertheless, the strip areas 52 may be realized in a manner directly adjoining one another.

Figure 17:
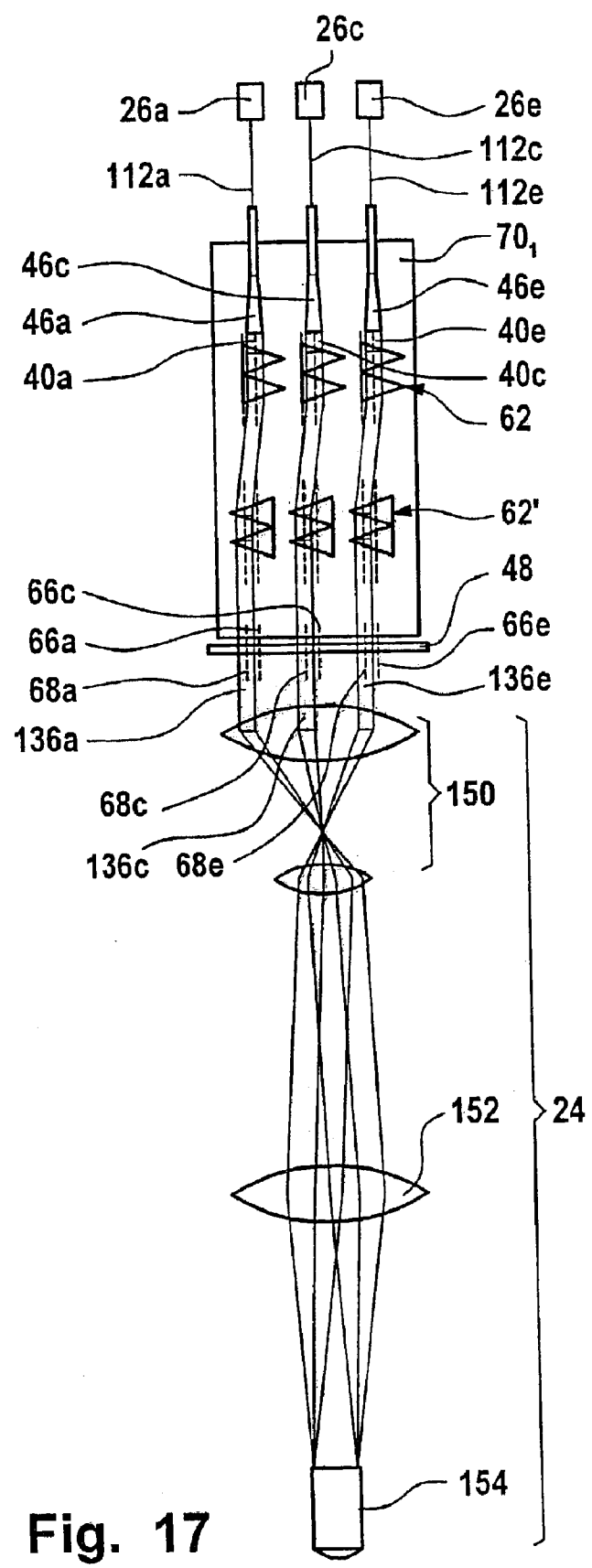
FIG. 17 shows a schematic sectional illustration of one embodiment of an exposure unit.

A section of one embodiment, which operates in accordance with the construction of FIG. 16 and leads to image spots in the arrangement according to FIG. 2, is illustrated in FIG. 17, wherein on account of the type of illustration only those elements located in the plane of drawing which coincides with the plane 140 are illustrated. The laser radiation is thus generated by means of the laser radiation sources 26a, 26c and 26e and the laser radiation is guided to the waveguide plate $70_1$ via light guides 112a, 112c and 112e. The beam shaping units 46a, 46c and 46e for the laser radiation 40a, 40c, 40e from the individual laser radiation sources 26a, 26c and 26e, which widen the laser radiation 40a, 40c and 40e to from a band widening in the deflection direction 44, are—as already described—provided in this waveguide plate.

As a result of the prism units 62 and 62' it is possible to offset the laser radiation 40a, 40c and 40e in relation to the original direction 66a, 66c and 66e, for example, into the illustrated exiting directions 68a, 68c and 68e which need not be at the same distance in the deflection direction 44 in relation to one another but can be different.

The beam shaping unit 48 then forms from the laser radiations 40a, 40c and 40e the bundles of radiation 136a, 136c and 136e which then enter the optical focusing means designated as a whole as 24.

The optical focusing means has, for its part, an ocular 150, a tube lens 152 and an objective 154, wherein the ocular reduces the size, for example, ten times and the objective, for example, fifty times so that the resulting image spots 30a, 30c and 30e, which are no longer illustrated in FIG. 17, are reduced in size approximately by a factor of five hundred in comparison with the bundles of radiation 136a, 136c and 136e.

In this respect, the tube lens 152 is preferably arranged between the ocular 150 and the objective 154 such that the distance corresponds each time to the focal distance.

Different modes of operation, with which a control 160 controls not only the exposure unit 18 but also the movements of the table 14, are conceivable for operating the inventive lithography exposure device.

In order to explain the individual modes of operation it is assumed for reasons of simplicity that the exposure movement direction 50 extends parallel to the X direction and, therefore, the deflection direction 44 parallel to the Y direction, as illustrated in FIG. 1.

Figure 18:
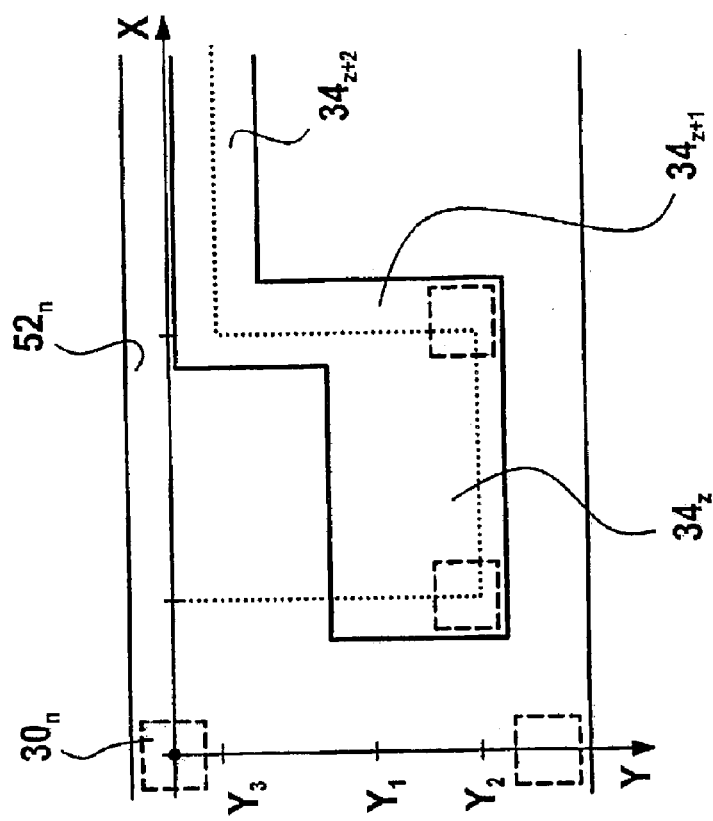
FIG. 18 shows a schematic illustration of an exposure within conversion areas in accordance with a first mode of operation.
Figure 19:
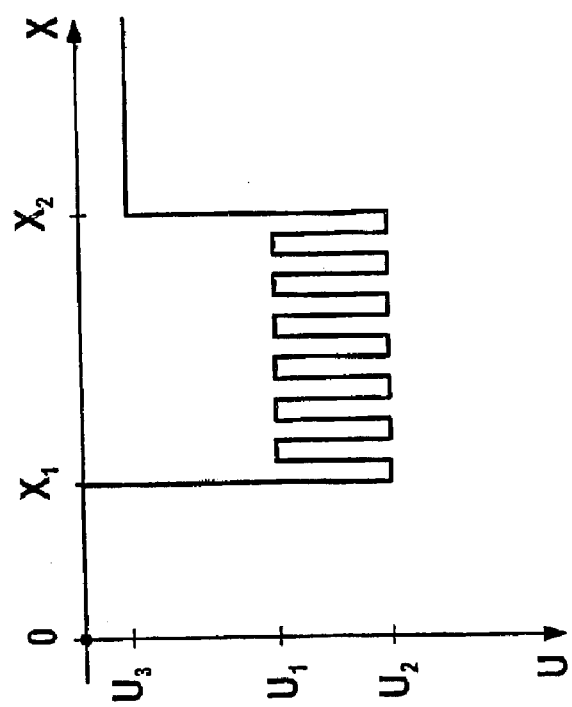
FIG. 19 shows an illustration of the voltages generated during the first mode of operation for the control of the deflection unit.
Figure 20:
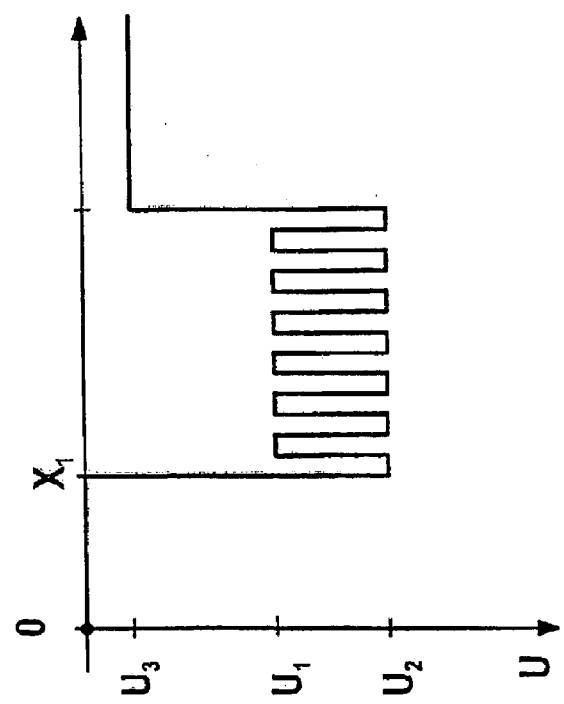
FIG. 20 shows an illustration corresponding to FIG. 19.

In a first mode of operation, illustrated in FIGS. 18 to 20, it is described how conversion areas $34_z$, $34_{z+1}$ and $34_{z+2}$ may be controlled by the control 160 by way of suitable control of the radiation source unit 20 and the deflection unit 22 as a function of the movement of the table 14 in X direction. For this purpose, a strip area 52n is singled out by way of example.

In order to generate the conversion area $34_z$ in the strip area 52n, the exposure spot $30_n$ has to be moved to the point $Y_1$ when the coordinate $X_1$ is reached by applying a voltage $U_1$ and immediately thereafter to the point $Y_2$ by applying a voltage $U_2$, as illustrated in FIGS. 18 and 19.

No exposure has yet taken place in the conversion area $34_z$ with the movement of the exposure spot 30 to the positions $Y_1$ and $Y_2$. For this purpose, the corresponding laser radiation source $26_n$ must be switched on.

Figure 21:
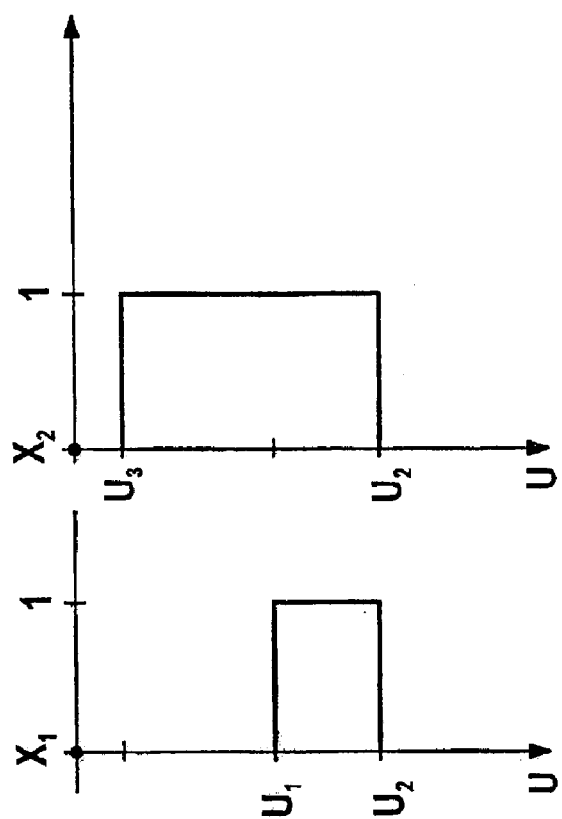
FIG. 21 shows an illustration of the activation of the respective laser radiation source as a function of the voltages illustrated in FIG. 20 for the control of the deflection unit.

This is brought about, as illustrated in FIGS. 20 and 21, when the position $X_1$ is reached, in that the laser radiation source $26_n$ is switched on at the voltage $U_1$ and remains switched on until the voltage $U_2$ is also reached. In order to be able to expose the surface extension of the conversion area $34_z$ extending in Y direction over its entire surface, the voltage U oscillates between the value $U_1$ and the value $U_2$ from the position $X_1$ of the table 14 up until the position $X_2$ of the table 14 is reached so that the exposure spot $30_n$ always moves between $Y_1$ and $Y_2$ and, therefore, exposes completely and continuously in the conversion area $34_z$.

When the coordinate $X_2$ is reached, the exposure area $34_{z+1}$ is, however, intended to be exposed, as illustrated in FIG. 18. For this purpose, the voltage U is lowered from the value $U_2$ to the value $U_3$, as illustrated in FIGS. 18 and 19, and at the same time when the position $X_2$ is reached the laser radiation source $26_n$ remains switched on, namely between the voltage $U_2$ and the voltage $U_3$; in order to expose the conversion area $34_{z+2}$ subsequent to the conversion area $34_{z+1}$, the voltage $U_3$ is maintained and, therefore, the exposure spot $30_n$ remains in its position. In the same way, the laser radiation source $26_n$ can, as illustrated in FIGS. 20 and 21, remain switched on from the position $X_2$ onwards in the range between the voltages $U_2$ and $U_3$ since the voltage no longer alters and remains at the value $U_3$.

The first mode of operation, illustrated in FIGS. 19 to 21, therefore provides for optional values of the voltage U to be adjustable for the positioning of the exposure spot $30_n$ within the strip area $52_n$ in order to position the exposure spot $30_n$ within the strip area $52_n$ at any optional location in Y direction.

At the same time, it is provided in the first mode of operation for the intensity of the laser radiation source $26_n$ to be switched on at any optional times and, therefore, at any optional positions of the table 14 in X direction.

A second mode of operation functions, in principle, in exactly the same way as the first mode of operation which has been described in FIGS. 18 to 21.

The second mode of operation differs from the first mode of operation merely in that the exposure spot $30_n$ cannot be optionally positioned in Y direction but rather in, for example, ten positions provided at equal distances over the width of the strip area $52_n$. This does, of course, limit the flexibility of the positioning in Y direction to these ten possible, discrete positions.

The procedure with the second mode of operation corresponds exactly to that of the first mode of operation but with the limitation that the voltage U is not altered optionally in accordance with the desired value but rather the voltage U is altered at a desired positioning of the exposure spot $30_n$ in Y direction such that the desired position within the dimensions of the exposure spot $30_n$ is located in one of the possible ten positions.

This does, however, presuppose that the exposure spot $30_n$ overlaps in these ten positions with the respectively adjacent positions so that a continuous conversion area $34_z$ can also be produced.

The ten possible positions of the exposure spot $34_n$ can be reached in that a voltage source is provided which can only generate ten discrete voltage values and an activation of the respectively associated deflection unit $42_n$ in the manner described above is brought about with these ten discrete voltage values.

Figure 22:
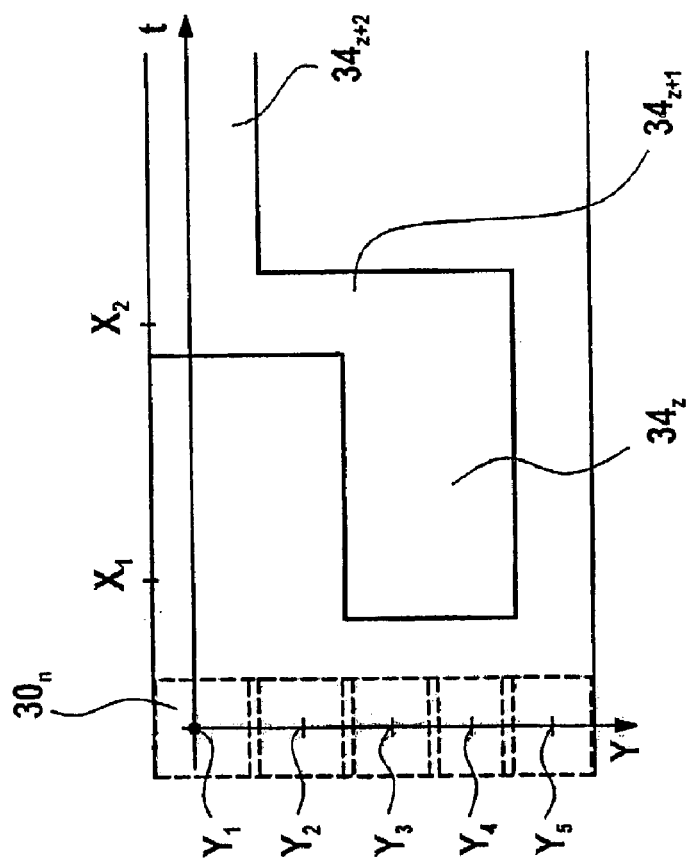
FIG. 22 shows an illustration of the exposure within several conversion areas in accordance with FIG. 18 in a third mode of operation.
Figure 23:
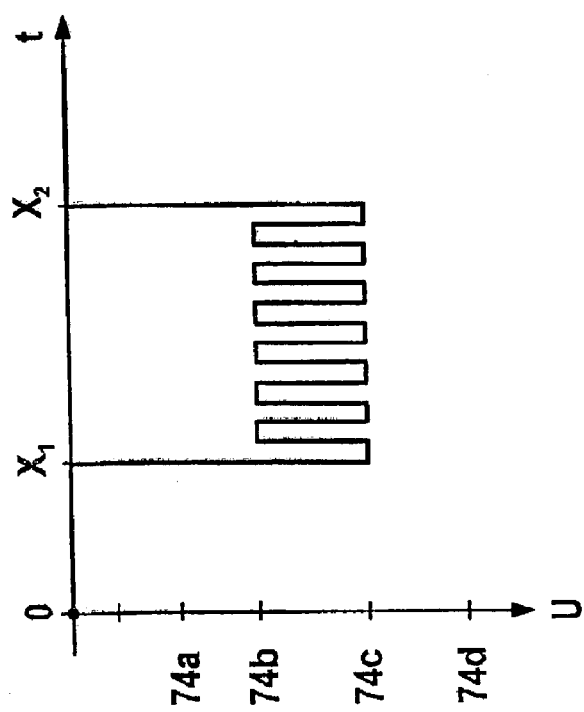
FIG. 23 shows an illustration of the voltages applied in the third mode of operation.

In a third mode of operation, illustrated in FIGS. 22 and 23, it is provided, for example, in the first embodiment according to FIGS. 6 and 7 for the first electrodes 74a to 74d to be arranged so as to be separated electrically from one another and, for example, for none of the electrodes 74a to d to be controlled in order to reach the first position $Y_1$ in Y direction, the electrode 74a to reach the second position $Y_2$, the electrodes 74a and 74b to reach the third position $Y_3$, the electrodes 74a, 74b and 74c to reach the fourth position $Y_4$ and the electrodes 74a, 74b, 74c and 74d to reach the fifth position $Y_5$ in Y direction so that only the voltage source must be able to generate a voltage value constantly and this voltage value will then be switched to the individual electrodes 74a to 74d separately, as illustrated in FIGS. 22 and 23.

In this respect, it is apparent that the conversion area $34_z$ is produced, for example, in that from the position $X_1$ onwards the voltage U is switched first of all to the electrodes 74a, 74b and 74c, an alternating additional connection of the electrode 74c to the electrodes 74a and 74b then takes place and, finally, when the position $X_2$ is reached no more voltage U is applied to any of the electrodes 74a to b and so the exposure spot 30 moves to the position $Y_1$ and from the position $X_2$ onwards remains in the position $Y_1$. In this respect, the conversion area $34_{z+2}$ is configured somewhat differently than with the first mode of operation on account of the impairment in the resolution due to only five possible Y positions $Y_1$ to $Y_5$.

The connecting of the intensity of the laser radiation source $26_n$ can be brought about in the same way as in the first mode of operation.

Figure 25:
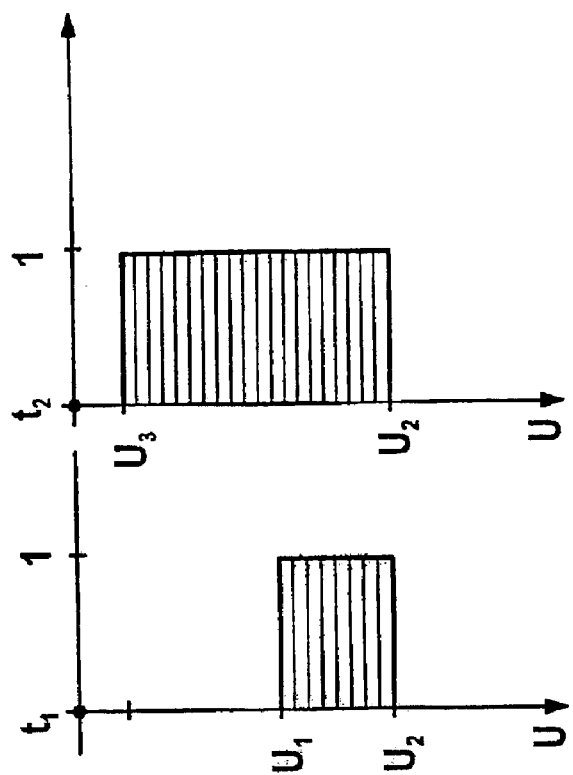
FIG. 25 shows an illustration of the activation of the laser radiation source as a function of the voltages applied in FIG. 24 for the control of the deflection unit in the fourth mode of operation.
Figure 24:
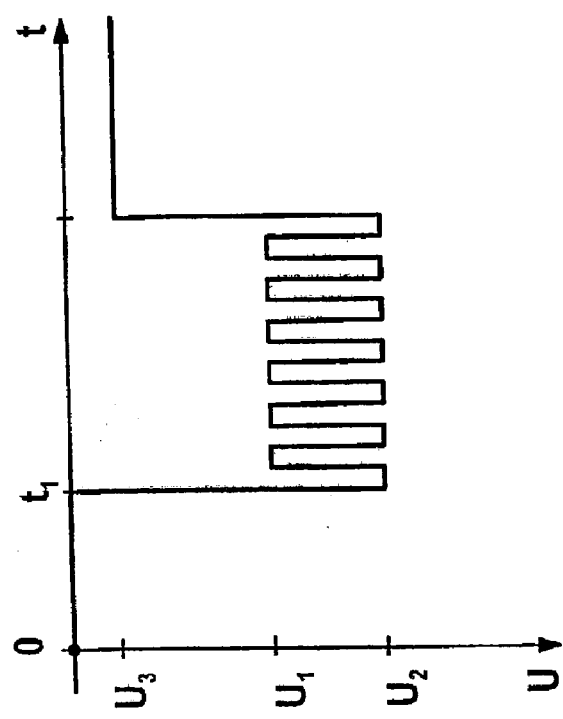
FIG. 24 shows an illustration of the voltages applied in a fourth mode of operation in accordance with FIG. 20.
Figure 26:
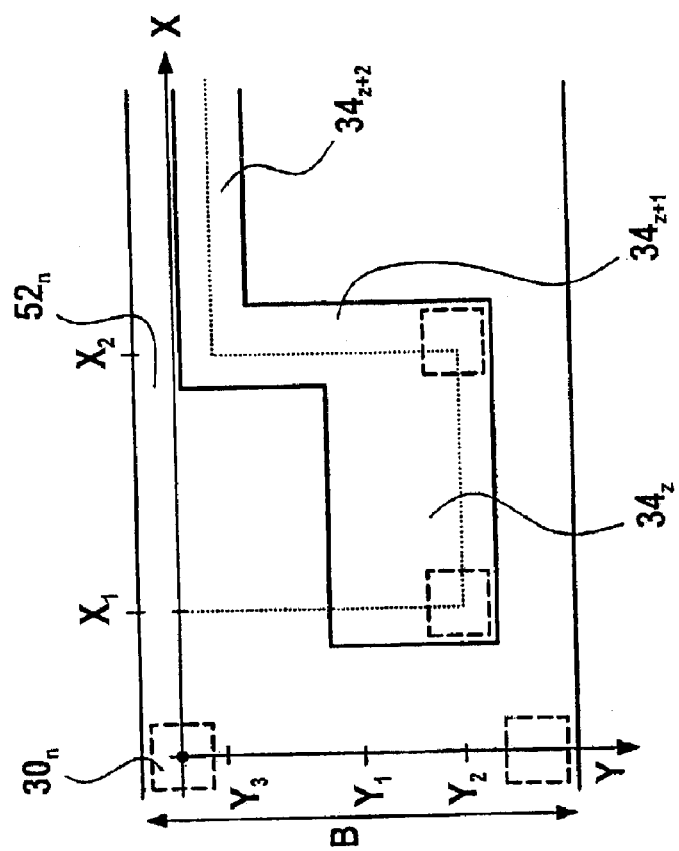
FIG. 26 shows an illustration of an exposure within conversion areas in a fifth mode of operation.

In a fourth mode of operation, illustrated in FIGS. 24 and 25, the positioning is brought about in the same way as in the first mode of operation, illustrated in FIGS. 18 and 19.

In modification of the first mode of operation, the corresponding laser radiation source $26_n$ is not switched on continuously between the respective voltage values $U_1$, $U_2$ and $U_3$ but rather the laser radiation source $26_n$ is operated in a pulsed manner and supplies, for example, pulses which follow one another at a constant time interval, wherein the time interval is so narrow that the individual pulses lead to individual image spots $30_n$ which are positioned so as to overlap.

Figure 27:
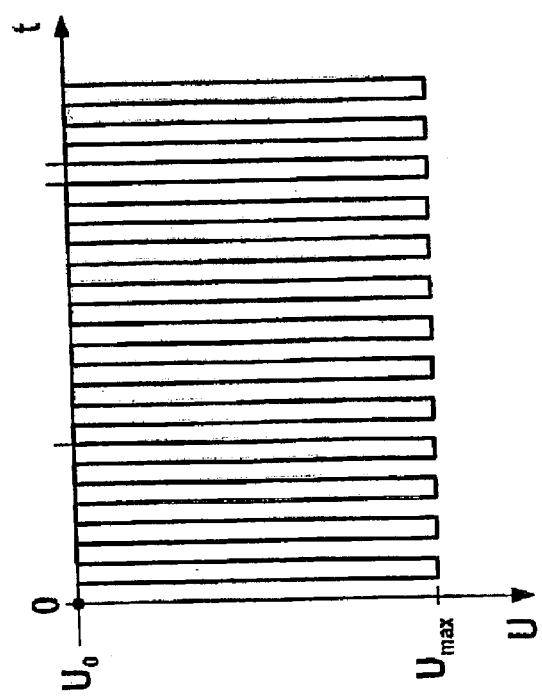
FIG. 27 shows an illustration of the activation of the deflection unit for the movement of the exposure spot.
Figure 29:
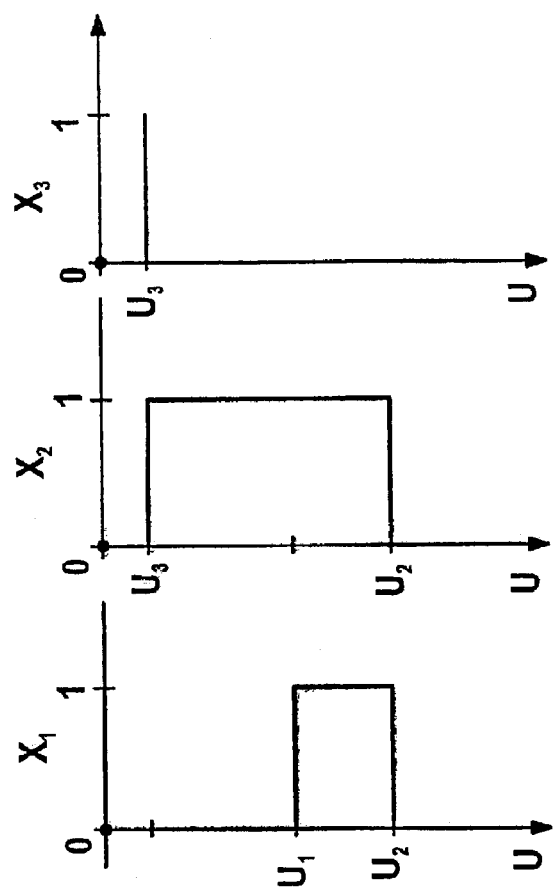
FIG. 29 shows an illustration of the activation of the laser radiation source as a function of the voltages illustrated in FIG. 28 for the control of the deflection unit.
Figure 28:
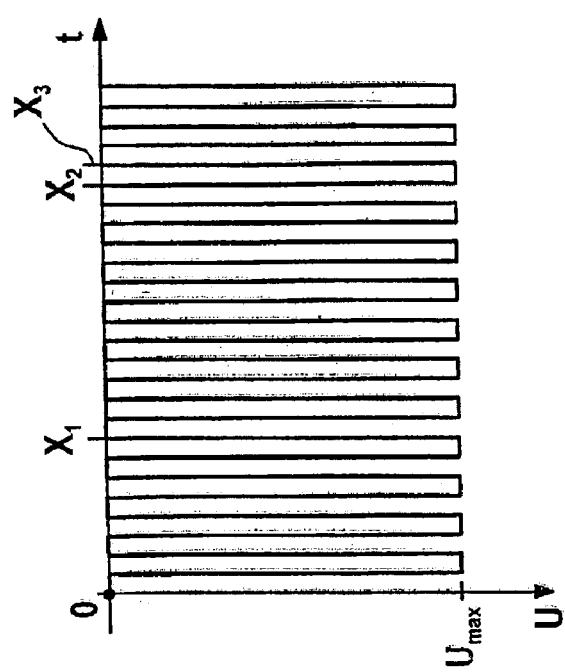
FIG. 28 shows an illustration of the voltage for the movement of the exposure spot in accordance with FIG. 27

In a fifth mode of operation, illustrated in FIGS. 26, 27, 28 and 29, the same conversion areas $34_z$, $34_{z+1}$ and $34_{z+2}$ as in the first embodiment are intended to be generated. For this purpose, however, the position of the exposure spot $30_n$ is, as illustrated in FIG. 27, not adjusted due to variation of the voltage U but rather the voltage U varies periodically between the voltage value $U_{max}$ required for the maximum deflection in Y direction and the voltage value $U_0$ so that, for example, for feeding the corresponding deflection unit $42_n$ a voltage source is used which generates a periodic function which need not automatically be a rectangular periodic function but can also be a sine periodic function or a triangular periodic function or a periodic saw tooth.

With such an activation of the deflection units $42_n$, the laser radiation source $26_n$ is switched on between the voltage value $U_1$ to $U_2$ when the position $X_1$ is reached and this condition is maintained until the position $X_2$ is reached so that an exposure for generating the conversion area $34_z$ is constantly brought about between the positions $Y_1$ and $Y_2$ in the case of the voltage U which constantly alters periodically and, with it, the periodic movement of the exposure spot $30_n$ in Y direction.

When the position $X_2$ is reached, the laser radiation source $26_n$ is left switched on between the voltage $U_2$ and the voltage $U_3$ so that the conversion area $34_{z+1}$ is generated and immediately afterwards the laser radiation source $26_n$ is switched on only when the voltage $U_3$ is reached so that an exposure takes place during the subsequent periodic movements of the exposure spot $30_n$ only when the position $Y_3$ is reached.

This fifth mode of operation presupposes that the periodicity, with which the exposure spot $30_n$ is moved over the entire width of the strip area $52_n$ is such that during the next pass through a specific Y position the exposure spot $30_n$ exposes a surface area of the type which overlaps with the exposure surface area during the preceding pass through this Y position.

In all the modes of operation, with which the positioning of the exposure spot $30_n$ is coupled directly to the X position of the slide 14, a coupling to the X position may also be brought about indirectly via the time axis t, i.e., the slide 14 is moved in X direction with a constant velocity and the position of the exposure spot $30_n$ is controlled in accordance with the time axis.

What is claimed is:

1. A lithography exposure device for producing exposed structures extending in a surface area of a light-sensitive layer, comprising:
   - a mounting device for the light-sensitive layer,
   - an exposure unit comprising several laser radiation sources,
   - an optical focusing means associated with the laser radiation sources for laser radiation exiting the respective laser radiation sources, said optical focusing means generating from the laser radiation of each of the laser radiation sources an exposure spot effective in the light-sensitive layer with a predetermined extension transverse to an exposure movement direction,
   - a movement unit for generating a relative movement between the optical focusing means and the mounting device in the exposure movement direction,
   - a control for controlling intensity and position of the exposure spots relative to the light-sensitive layer in such a manner that a plurality of conversion areas is generatable in the light-sensitive layer by means of the exposure spots, the material of the light-sensitive layer being converted in said areas from an initial state into the exposed state and said areas together resulting in the exposed structure,
   - said exposure spots when undeflected being arranged at a certain transverse distance with respect to each other in a direction transverse to the exposure movement direction, said certain transverse distance between said exposure spots being greater than said predetermined extension of said exposure spots
   - a controllable deflection device being provided between the laser radiation sources and the optical focusing means for the movement of the exposure spot in the deflection direction extending transverse to the exposure movement direction, said controllable deflection device being adapted to enable generation of all the conversion areas located within a strip area due to movement of the exposure spot in a deflection direction, said strip area extending in the exposure movement direction and having transversely to the exposure movement direction a width amounting to a greater extent than the extension of the exposure spot in this direction.

2. A lithography exposure device as defined in claim 1, wherein the deflection device operates electro-optically.

3. A lithography exposure device as defined in claim 1, wherein the strip areas associated with the laser radiation sources are located directly next to one another.

4. A lithography exposure device as defined in claim 3, wherein the strip areas located next to one another overlap in a direction transverse to the exposure movement direction.

5. A lithography exposure device as defined in claim 1, wherein strip areas extend beyond the light-sensitive layer in exposure movement direction.

6. A lithography exposure device as defined in claim 1, wherein the deflection device has a separate deflection unit for the laser radiation of each laser radiation source, the deflection of the laser radiation being brought about with said unit in the deflection direction for the positioning of the exposure spot in deflection direction within the strip area corresponding to it.

7. A lithography exposure device as defined in claim 6, wherein the exposure spot is positionable within the strip area as required with the deflection unit.

8. A lithography exposure device as defined in claim 6, wherein each of the deflection units of the deflection device is controllable individually by the control.

9. A lithography exposure device as defined in claim 6, wherein the deflection units are arranged in several planes following one another in the exposure movement direction.

10. A lithography exposure device as defined in claim 9, wherein in a sequence of strip areas following one another in deflection direction the deflection units of strip areas adjacent to one another in the sequence of strip areas are located in different planes.

11. A lithography exposure device as defined in claim 10, wherein in the sequence of strip areas following one another those deflection units associated with the strip areas separated from one another in the sequence of strip areas by at least one strip area located therebetween are located in the same plane.

12. A lithography exposure device as defined in claim 10, wherein the deflection units for the strip areas located separate from one another in the sequence of strip areas by a place number corresponding to the number of planes are located in each of the planes following one another in exposure movement direction.

13. A lithography exposure device as defined in claim 6, wherein each electro-optical deflection unit has at least one beam-deflecting spatial area consisting of electro-optical material and having the laser radiation passing through it, the refractive index in said spatial area being variable electro-optically in comparison with the refractive index in its surroundings, and wherein with a refractive index in the at least one spatial area deviating from the refractive index of the surroundings the sum of the spatial areas of the deflection unit causes the laser radiation to exit from the deflection unit in an exiting direction extending differently in comparison with an original direction.

14. A lithography exposure device as defined in claim 13, wherein the spatial area is formed within a waveguide plate consisting of an electro-optical material and extending with its flat sides parallel to the deflection direction.

15. A lithography exposure device as defined in claim 14, wherein the waveguide plate consists of an electro-optical material and extends beyond the spatial area.

16. A lithography exposure device as defined in claim 13, wherein the spatial area is arranged between a first and a second field electrode.

17. A lithography exposure device as defined in claim 16, wherein the field electrode is arranged on oppositely located flat sides of a waveguide plate including the spatial area.

18. A lithography exposure device as defined in claim 16, wherein the first field electrode is formed by electrode material applied directly to the flat side of the waveguide plate.

19. A lithography exposure device as defined in claim 16, wherein the second field electrode is formed by electrode material applied directly to the second flat side of the waveguide plate.

20. A lithography exposure device as defined in claim 13, wherein a shape of the spatial area is adapted to be determined by determining a spatial course of an electric field passing through the waveguide plate.

21. A lithography exposure device as defined in claim 20, wherein the electric field is defined by the shape of the first field electrode.

22. A lithography exposure device as defined in claim 21, wherein the second field electrode extends beyond the spatial area.

23. A lithography exposure device as defined in claim 13, wherein the shape of the spatial area is determined by determining a spatial shape of at least one domain area in the electro-optical material of the waveguide plate, said domain area being polarized spontaneously and electrically.

24. A lithography exposure device as defined in claim 23, wherein the field electrodes extend beyond the domain area.

25. A lithography exposure device as defined in claim 13, wherein each deflection unit comprises several spatial areas with a refractive index variable electro-optically.

26. A lithography exposure device as defined in claim 25, wherein the several spatial areas are arranged so as to follow one another in the direction of propagation of the respective laser radiation.

27. A lithography exposure device as defined in claim 25, wherein the several spatial areas are arranged in the same waveguide plate.

28. A lithography exposure device as defined in claim 25, wherein each deflection unit offsets the laser radiation so as to be essentially parallel in deflection direction by means of two spatial areas acting in opposite directions.

29. A lithography exposure device as defined in claim 13, wherein the at least one beam-deflecting spatial area widens or narrows like a wedge in deflection direction and has the entire laser radiation passing through it.

30. A lithography exposure device as defined in claim 29, wherein the spatial area is designed similar to a prism area.

31. A lithography exposure device as defined in claim 1, wherein the laser radiation propagates in the waveguide plate in deflection direction in a widened manner.

32. A lithography exposure device as defined in claim 31, wherein the laser radiation is widened parallel to the deflection direction by a beam shaping unit.

33. A lithography exposure device as defined in claim 32, wherein the beam shaping unit is integrated into the waveguide plate.

34. A lithography exposure device as defined in claim 32, wherein the beam shaping unit operates electro-optically.

35. A lithography exposure device as defined in claim 32, wherein the beam shaping unit is designed as a GRIN lens.

36. A lithography exposure device as defined in claim 1, wherein the control controls each of the deflection units with a voltage corresponding to the required position of the respective exposure spot within the respective strip area.

37. A lithography exposure device as defined in claim 36, wherein the voltage is continuously variable.

38. A lithography exposure device as defined in claim 36, wherein the voltage is variable in discrete steps.

39. A lithography exposure device as defined in claim 1, wherein the refractive index is variable synchronously in the several spatial areas of one deflection unit.

40. A lithography exposure device as defined in claim 1, wherein the refractive index is controllable individually in the case of the several spatial areas of one deflection unit.

41. A lithography exposure device as defined in claim 40, wherein the individual spatial areas are controlled either without voltage or with a predetermined voltage value.

42. A lithography exposure device as defined in claim 1, wherein the control controls the deflection unit with a voltage corresponding to the required position of the exposure spot within the respective strip area.

43. A lithography exposure device as defined in claim 42, wherein the voltage is variable continuously by the control.

44. A lithography exposure device as defined in claim 42, wherein the voltage is variable by the control in discrete steps.

45. A lithography exposure device as defined in claim 42, wherein the electrodes are activatable synchronously by the control in the case of several spatial areas of a deflection unit.

46. A lithography exposure device as defined in claim 44, wherein the electrodes associated with the individual spatial areas are activatable individually by the control in the case of several spatial areas of a deflection unit.

47. A lithography exposure device as defined claim 1, wherein the control positions the exposure spot within the strip area during the course of the movement of the exposure spot in the exposure movement direction and in the deflection direction and then an exposure is brought about in the exposure spot by way of control of the intensity of the laser radiation source when this exposure spot is located within a conversion area.

48. A lithography exposure device as defined in claim 47, wherein the control exposes continuously for as long as the exposure spot is located in a conversion area.

49. A lithography exposure device as defined in claim 47, wherein the control exposes in a pulsed manner for as long as the exposure spot is located in the conversion area.

50. A lithography exposure device as defined in claim 1, wherein the exposure spot is moved constantly back and forth between a minimum and a maximum position in the strip area by the control in accordance with a periodic function and an exposure is then brought about by way of control of the intensity of the laser radiation source when the exposure spot has reached its position in deflection direction.

* * * * *